United States Patent
Fujimaki

(10) Patent No.: US 6,709,941 B2
(45) Date of Patent: Mar. 23, 2004

(54) METHOD FOR MANUFACTURING SEMICONDUCTOR DEVICE EMPLOYING SOLID PHASE DIFFUSION

(75) Inventor: Hirokazu Fujimaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/288,327

(22) Filed: Nov. 6, 2002

(65) Prior Publication Data

US 2003/0186562 A1 Oct. 2, 2003

(30) Foreign Application Priority Data

Mar. 28, 2002 (JP) ......................... 2002-092640

(51) Int. Cl.$^7$ ............................................ H01L 21/331
(52) U.S. Cl. ...................... 438/341; 438/342; 438/369; 438/370
(58) Field of Search ................. 438/791, 341, 438/342, 335, 369, 370, 558, 564

(56) References Cited

U.S. PATENT DOCUMENTS

| | | | |
|---|---|---|---|
| 5,504,018 A | * | 4/1996 | Sato ............................ 438/311 |
| 5,962,880 A | * | 10/1999 | Oda et al. .................... 257/198 |
| 6,469,367 B2 | * | 10/2002 | Kondo et al. ................ 257/592 |
| 6,482,710 B2 | * | 11/2002 | Oda et al. .................... 438/316 |

FOREIGN PATENT DOCUMENTS

| | | |
|---|---|---|
| JP | 8-335584 | 12/1996 |
| JP | 10-092831 | 4/1998 |
| JP | 10-092832 | 4/1998 |
| JP | 10-092837 | 4/1998 |

* cited by examiner

Primary Examiner—Michael Trinh
(74) Attorney, Agent, or Firm—Volentine Francos, PLLC

(57) ABSTRACT

In a method for manufacturing a semiconductor device, an N type single-crystal silicon substrate having a first silicon oxide film and a P type poly-crystal silicon layer is provided. A silicon nitride film is formed on the P type poly-crystal silicon layer. A side wall of the silicon nitride film is formed in an opening in the P type poly-crystal silicon layer above a portion expected to provide an active region. The first silicon oxide film has an opening therein which is larger than the opening formed in the P type poly-crystal silicon layer. Then, an N type IV-group semiconductor mixed crystal layer having a smaller band gap than silicon to a desired thickness is grown on the single-crystal silicon substrate on which a surface of the portion expected to provide said active region is exposed. A non-doped single-crystal silicon layer is grown on the IV-group semiconductor mixed crystal layer to a desired thickness. Then, boron is diffused at a desired concentration from a surface of the non-doped single-crystal silicon layer. A side wall containing a second silicon oxide film is formed on an inner side of the side wall of the silicon nitride film. Finally, a phosphorus-doped N type poly-crystal silicon layer is grown throughout on the surface to perform processing and phosphorus diffusion on said N type poly-crystal silicon layer in order to provide an emitter electrode.

19 Claims, 18 Drawing Sheets

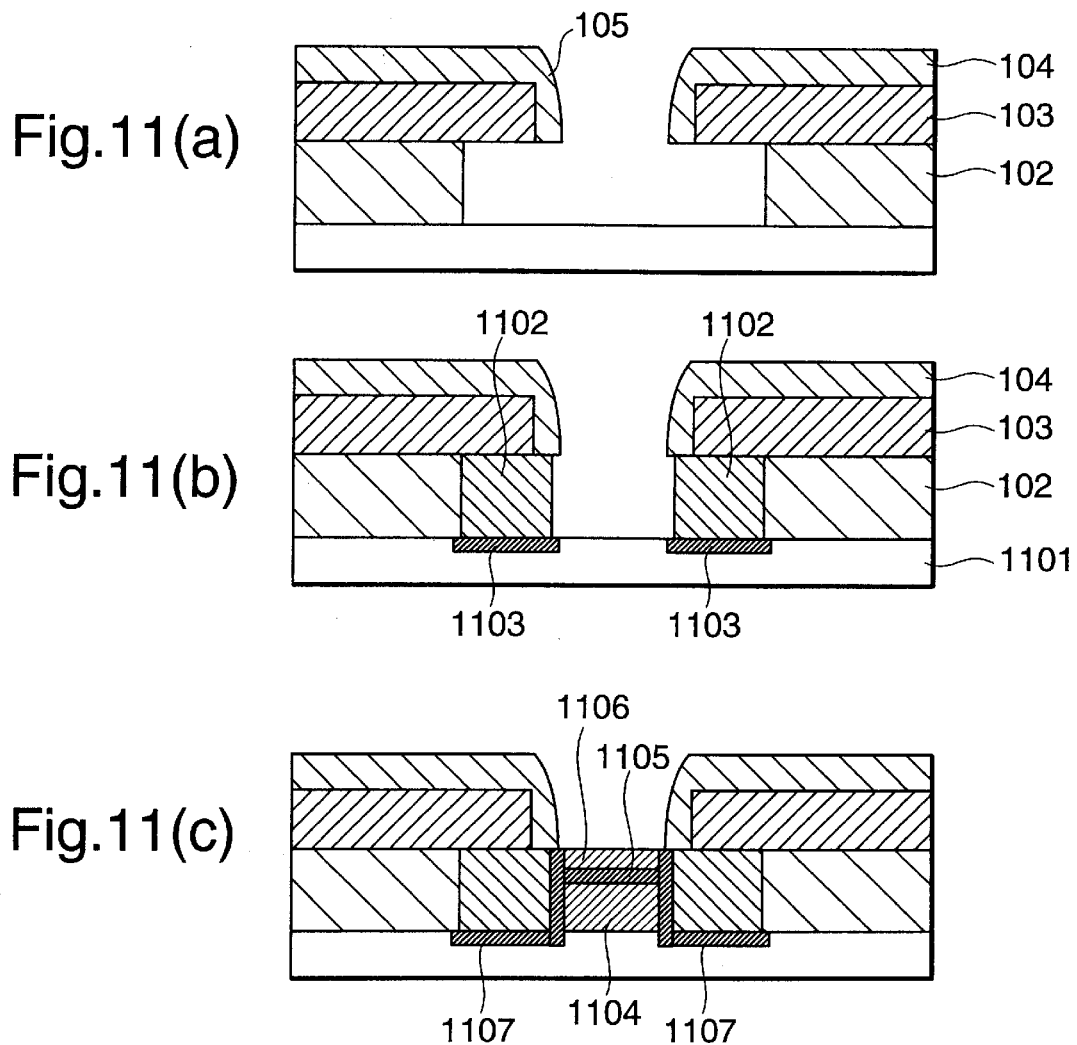

FIG.13(a)
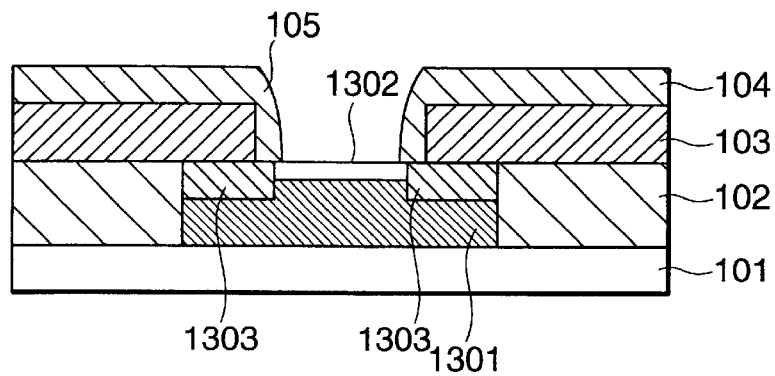
11B+, 500eV, 1E15atoms / cm2
FIG.13(b)
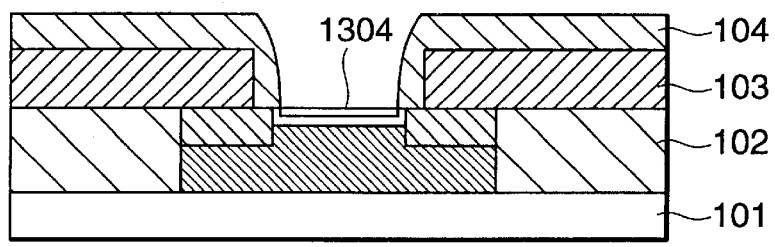
FIG.13(c)
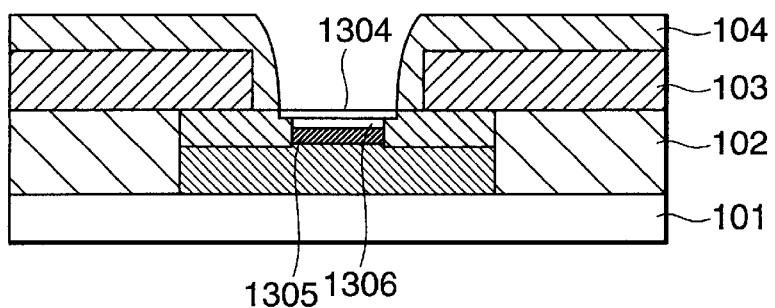

METHOD FOR MANUFACTURING SEMICONDUCTOR DEVICE EMPLOYING SOLID PHASE DIFFUSION

BACKGROUND OF THE INVENTION

The present invention relates to a method for manufacturing a semiconductor device and, more particularly to, a silicon-based heterodyne-junction bipolar transistor made of silicon or germanium mainly.

The performance of an operating speed of the bipolar transistors depends on a variety of kinds of parasitic resistance and parasitic capacitance and also a carrier transit time in an intrinsic base region. These items can be classified into a few factors, of which the base resistance ($R_b$), the collector-base junction capacitance ($C_{tc}$), and the carrier transit time in the intrinsic base region ($\tau_F$) may be said to be highly contributive parameters. The parameter $\tau_F$ is closely related to a maximum cut-off frequency ($f_{Tmax}$), which is a measurement value. The device construction of the transistors may be said to have been developed along a guideline for improving these parameters.

The specific method to improve the parameter $f_{Tmax}$ is to reduce a base width, so that in a typical vertical device construction an important technology has been how to form a shallow junction base in the developments of high-speed bipolar transistors. A base junction with a depth of 0.1 μm or less has been realized by an ion injection method of injecting ions of boron or boron di-fluoride ($BF_2$) at injection energy of 10 KeV, a solid phase diffusion method of diffusion from a solid phase of boron glass, etc. and so is mass-produced presently with an $f_{Tmax}$ value of 30–50 GHz or so.

A trial to further reduce the thickness of the base layer by promoting these technologies leads to a problem of deteriorated punch-through breakdown voltage. The punch-through breakdown voltage refers to such a punch-through phenomenon that a reverse-biased voltage applied to the collector causes a collector's depletion layer to spread and reach an emitter's depletion layer and so occurs more frequently as the base layer is more reduced in film thickness. To avoid this phenomenon, it is indispensable to increase the concentration of a base carrier. An increase in the base carrier concentration, however, decreases its ratio with respect to an emitter carrier concentration already set at a solid solution level to increase a degree of reverse injection of holes from the base layer to the emitter layer, thus decreasing a current amplification factor, which is a ratio between a base current and a collector current. This provides a physical limit of the performance of the silicon (Si)-based bipolar transistors, so that a practical speed performance limit of this type of devices has generally been considered to be 70–80 GHz as $f_{Tmax}$.

To break through this performance barrier which has been considered to be a limit, such a technology has been suggested by IBM near the end of 1980s. It is an invention of a silicon-germanium hetero-junction bipolar transistor (Si-Ge-HBT). The present invention is based on such a technology that Ge having a smaller band gap (Eg) than silicon is mixed into the base layer by about 10% to thereby narrow the band gap (Eg) of the base layer. Since Si and Ge have a band gap difference therebetween, the composition ratio can be changed from 0% to 100% continuously through thorough solid solution to Si.

A literature says that in the strain state (range in which the lattice is not relaxed), a band gap change with respect to a Ge composition is −7.3 meV/Ge% for pure Si. Taking into account that thermal energy of the room temperature is about 27 meV, even such a degree of band gap difference makes up a potential barrier against reverse injection of holes from the base to the emitter, thus providing a factor that can independently control an injection efficiency, which has been determined by a difference in carrier concentration between the emitter and the base. As a result, even in a case where the carrier concentration ratio is reversed between the base and the emitter, it is possible to obtain a current amplification factor (hFE) of 100 or more.

As mentioned above, an HBT with a base band gap reduced by mixture of Ge into Si is capable of avoiding a decrease in the current amplification factor even with an increase in the base concentration to thereby further reduce the film thickness of the base width, thus resulting in a great increase in the $f_{Tmax}$. Furthermore, it can enjoy a decrease in the resistivity of the intrinsic base, thus improving the overall speed performance indicated by $f_{Tmax}/(R_b \times C_{tc})$.

The following will describe a manufacturing method and a profile structure by use of a typical conventional technology. FIG. 19 shows a profile structure. FIGS. 20 show cross-sectional views of a transistor before and-after the base layer undergoes selective epitaxial growth. In order to improve the performance including external base resistance, a described self-alignment type construction of transistors is necessary. First, in a P type Si substrate 1901 with surface orientation (100) is formed a buried N⁺ type layer, on a surface of which is grown an N type epitaxial layer. On the Si substrate 1901 are also adhered a thermal oxide film 1902, and a boron-doped poly-crystal silicon layer 1903 sequentially. An opening is formed through the boron-doped P⁺ type poly-crystal Si layer 1903 and the thermal oxide film 1902, after which a silicon nitride film 1904 is adhered and etched in an anisotropic manner to form a side wall (SW) formed of a nitride film and a silicon nitride film SW1905 as shown in FIG. 20A.

Then, a Si-Ge layer and a Si layer are grown in an selective epitaxial manner. Prior to this selective epitaxial growth, the surface is cleared of a natural oxide film adhered thereto by washing it with diluted hydrofluoric acid (HF) and then thermally treated at 900° C. in a hydrogen atmosphere with water and oxygen regulated at 10 ppb or less at 15 Torr for five minutes or so. This thermal treatment is carried out to completely remove the natural oxide film formed after washing with HF. Then, the temperature is lowered to 650° C. or so, after which are introduced di-chloro silage ($SiH_2Cl_2$) as a Si source gas, germanium hydride ($GeH_4$) as a Ge source gas, phosphorous hydride ($PH_3$) as an N type doping gas, and diborane ($B_2H_6$) as a P type doping gas, followed by a hydrogen chloride (HCl) gas to reserve growth selectivity with respect to the silicon nitride film and the silicon oxide film, thus carrying out epitaxial growth.

In a first process step of growing the Si-Ge layer, the Ge concentration is controlled to have a gradient such that it may be 15% on the collector and 5% on the emitter side. This control is conducted by changing a flow rate of $GeH_4$ continuously. The growth rate in this temperature range, however, is determined by the concentration of $GeH_4$ in the atmosphere, so that the control needs to be conducted taking this into account.

As for conductivity types, first an M type Si-Ge layer (1906) into which phosphorus (P) is doped at a value a little less than 1E17 atoms/cm³ is grown to thickness of 40 nm, then a P type Si-Ge layer (1909) into which boron (B) is doped at about 1E19 atoms/cm³ is grown to thickness of 10 nm, and finally a non-doped Si-Ge layer is grown to thickness of 10 nm. As a result, a Si-Ge layer with thickness of about 60 nm is grown. In this step, also from the boron-doped P+ type poly-crystal Si layer (1903), a base link portion diffusion layer (1907) of the P type poly-crystal Si by self-alignment grows to link with the N type Si-Ge layer (1906) grown from the Si substrate (1901).

Next, the temperature is raised to 700° C. to then grow a cap Si layer (1908). It is a pure silicon layer having film thickness of 30 nm containing no Ge. A cross-sectional view of this step is shown in FIG. 20B. Thus, a series of epitaxial processes is used to form the active regions of the transistor and establish contact between these regions and the P+ type boron-doped poly-crystal Si layer which provides the base electrode. The subsequent process is used to generate N+ type emitter poly-crystal Si and carry out annealing treatment (RTA: Rapid Thermal Annealing) to diffuse phosphorus (P) into the Si layer, thus forming a hetero-junction.

As described above, by using a Si-Ge as the base layer, it is possible to manufacture a transistor with a base width of 300 Å with a base peak carrier concentration being 1E19 atoms/cm$^3$ and also to obtain an effect of electric field acceleration of the carrier, thus realizing a $f_{Tmax}$ in excess of 100 GHz.

The operating speed of the devices, however, is desired to be higher and higher with a demand for a rapid increase in transmission capacity in, for example, an application of information communication. Taking into account that a compound-based device made of gallium arsenic (GaAs) or indium phosphorus (InP) already has a performance speed of 200 GHz as $f_{max}$, even such a silicon-based bipolar transistor as to have a speed of 100 GHz may not be considered to be excellent in speed performance and is demanded to be higher in speed. The silicon-based bipolar transistor, however, is relatively inexpensive in manufacture and stable in quality and so may be said to be highly superior in performance/cost ratio if it has almost the same speed performance as the compound-based device.

Furthermore, owing to the developments of the Si-Ge-HBT, the physical limit of the-device may be said to be dependent on the solid solubility of boron in the base. If the solid solubility of boron in the Si base is supposed to be 1E2 through 1E2 atoms/cm$^3$ or so, a concentration of only 1/10 of this value is realized in the present-day Si-Ge-HBT. In this view, if a high peak concentration can be realized by any process, sufficient punch-through breakdown voltage and current amplification factor should be obtained even if the base width is reduced to 150 Å or less. If a Si-Ge-HBT having such a profile structure is realized, it may be possible to obtain speed performance at least the same as that of the compound-based device.

SUMMARY OF THE INVENTION

In view of the above-mentioned problems of the conventional Si-Ge-HBT, the present invention may increase such a concentration of boron in a base layer as not to have reached possible highest solid solubility in Si, and may decrease film thickness of the base layer, thus realizing as much as possible such a physical limit value of speed performance of a Si-Ge-HBT as not to have been established yet. Further, the present invention may provide a novel and improved semiconductor device and method for manufacturing the same for giving high reproducibility of that high performance even in mass-production and stable device characteristics.

In a method for manufacturing a semiconductor device, an N type single-crystal silicon substrate having a first silicon oxide film and a P type poly-crystal silicon layer is provided. A silicon nitride film is formed on the P type poly-crystal silicon layer. A side wall of the silicon nitride film is formed in an opening in the P type poly-crystal silicon layer above a portion expected to provide an active region. The first silicon oxide film-has an opening therein which is larger than the opening formed in the P type poly-crystal silicon layer. Then, an N type IV-group semiconductor mixed crystal layer having a smaller band gap than silicon to a desired thickness is grown on the-single-crystal silicon substrate on which a surface of the portion expected to provide said active region is exposed. A non-doped single-crystal silicon layer is grown on the IV-group semiconductor mixed crystal layer to a desired thickness. Then, boron is diffused at a desired concentration from a surface of the non-doped single-crystal silicon layer. A side wall containing a second silicon oxide film is formed on an inner side of the side wall of the silicon nitride film. Finally, a phosphorus-doped N type poly-crystal silicon layer is grown throughout on the surface to perform processing and phosphorus diffusion on said N type poly-crystal silicon layer in order to provide an emitter electrode.

BRIEF DESCRIPTION OF THE DRAWINGS

FIG. 11A is a cross-sectional view for showing a transistor according to the a ninth embodiment of the present invention after a nitride film side wall is formed, FIG. 11B is a cross-sectional view for showing the transistor according to the ninth embodiment of the present invention after poly-crystal Si in an intrinsic base region is etched, and FIG. 11C is a cross-sectional view for showing the transistor according to the ninth embodiment of the present invention after a Si-Ge (or Si-Ge-C) layer is grown and an intrinsic base is formed;

FIG. 13A is a cross-sectional view for showing a transistor according to an eleventh embodiment of the present invention after a Si-Ge (or Si-Ge-C) layer and a Si layer are grown, FIG. 13B is a cross-sectional view for showing the transistor according to the eleventh embodiment of the present invention after protection oxidation is performed and then an ion is injected, and FIG. 13C is a cross-sectional view for showing the transistor according to the eleventh embodiment of the present invention after annealing;

DETAILED DESCRIPTION OF THE PREFERRED EMBODIMENTS

Figure 1:
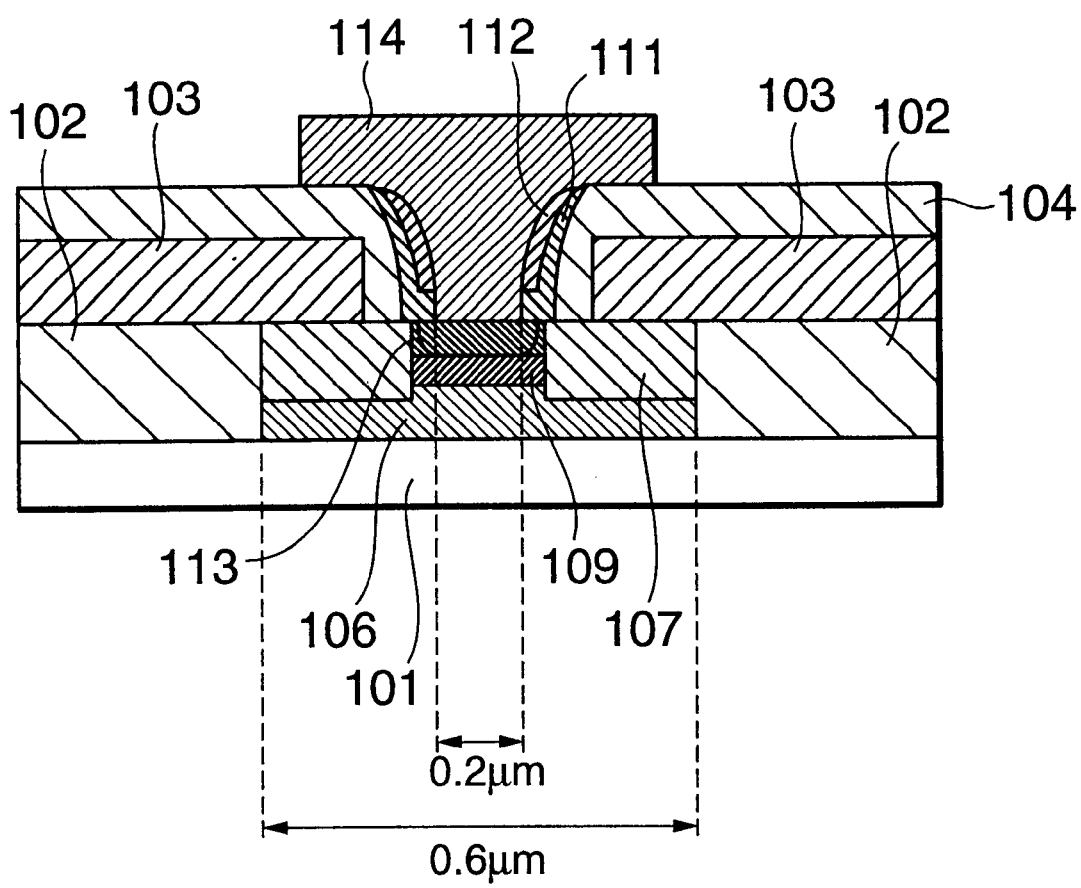
FIG. 1 is a cross-sectional view for showing an active region of a transistor according to a first embodiment of the present invention.

The following will describe in detail preferred embodiments of a semiconductor device manufacturing method according to the present invention with reference to the accompanying drawings. In the present specification and the drawings, the components having essentially the same functions are indicated by the same reference numerals, to omit duplicate explanation.

First Embodiment

Figure 3:
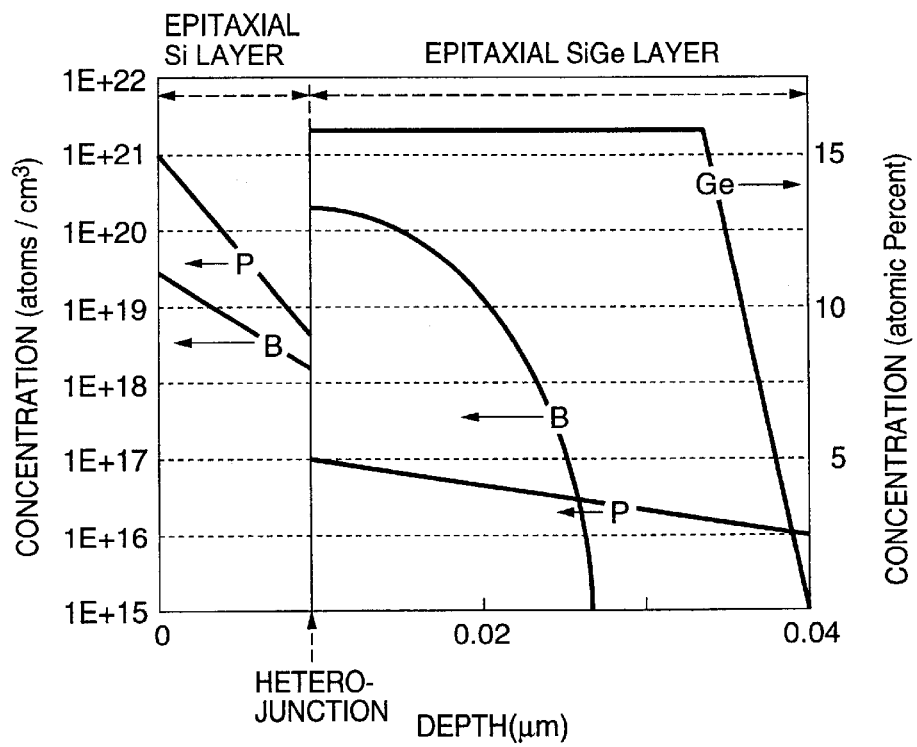
FIG. 3 is a graph for showing a concentration profile structure of a transistor junction according to the first embodiment of the present invention.

A cross-sectional view of an active region of a bipolar transistor according to the first embodiment of the present invention is shown in FIG. 1 and its profile structure, in FIG. 3. This profile structure is based on a result obtained by simulation using SSPREM, which is an improved version of a typical semiconductor process simulator SPREM. As a diffusion model is employed a HIGH.CONCFULL.CPL model, which takes into account a high concentration dot defect and impurity diffusion. There is such a region containing 17% of Ge as to extend from a base layer to the upper part of a collector layer. An emitter is N type in conductivity and made of pure Si containing no Ge into which phosphorus is doped. A PN junction between the base and the emitter is formed at a position where a carrier concentration of phosphorus in the emitter region is equal to that of boron in the base region, which position completely agrees with a position of the metallurgical hetero-junction between Si and S-Ge. Furthermore, over this hetero-junction interface, owing to a segregation phenomenon, the boron concentration increases by one digit or more across an interface from the Si layer to the Si-Ge layer.

In a variant of the present embodiment, the Ge concentration may be set so as to be higher on the collector side than on the emitter side. Specifically, the Ge concentration is set at 25% on the collector side and 10% on the emitter side, by which the band gap changes continuously to give rise to a potential difference of a value which is a little higher than 100 mV, which accelerates a minority carrier of electrons and so reduces $\tau_F$, thus resulting in a higher cur-off frequency. Although the-Ge concentration is set at 1% in a series of simulations, it is practically set at 10% or more. A change in the Ge concentration, however, has no effect on the segregation phenomenon qualitatively, so that the following description is based on that Ge concentration.

The present embodiment has such a profile that the active base region has a width of 16 nm and the peak boron concentration is 1E20 atoms/cm$^3$, thus giving expected transistor performance of both $\tau_F$ of 1 pico-second or so and punch-through breakdown voltage of 2.0 V or more.

Furthermore, if a low-pressure epitaxial growth apparatus which enables the above-mentioned Si-Ge epitaxial growth and also which is suitable for mass-production is used, selective Si epitaxial growth carried out at 700° C. or so is inevitably accompanied by about ±30% of fluctuations in overall sheet resistance and about ±20% of fluctuations in film thickness in the worst case. This is tantamount to about two-fold fluctuations in phosphorus concentration at the hetero-junction interface.

By the present embodiment, however, at the hetero-junction between Si and Si-Ge, the boron concentration increases by one digit or more across the interface between the emitter side Si layer and the base side Si-Ge layer. That is, it can be known that since segregation occurring at the hetero-junction interface causes the boron concentration to increase to such a extent as to sufficiently absorb the fluctuation in the phosphorus concentration, reproducibility of a PN junction position once formed is extremely high. At least the above-mentioned two-fold fluctuations or so in the phosphorus concentration can be absorbed owing to the profile structure. In this sense, the profile structure may be said to be highly stable in formation of the electric PN junction position between the emitter and the base in a Si-Ge-HBT.

Figure 2A:
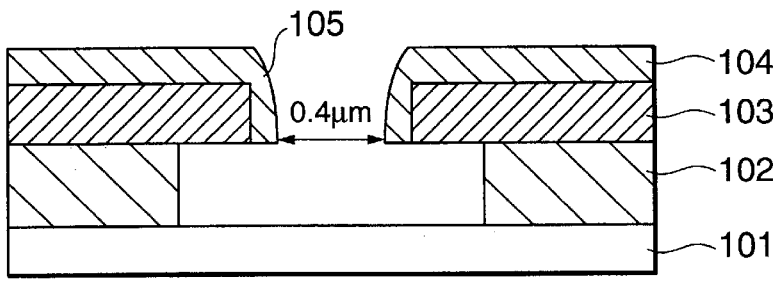
FIG. 2A is a cross-sectional view for showing the transistor according to the first embodiment of the present invention after a nitride film side wall is formed.

The following will describe an HBT to which the present profile structure is applied. This transistor has a self-alignment type structure, a method for manufacturing which is described as follows. First, a publicly known technology is used to form a portion expected to become a transistor active region such as shown in FIG. 2A. In this case, a Si substrate 101 is P type in conductivity and has orientation (100) is obtained by forming a buried N$^+$ type layer (not shown) by doping antimony (Sb) and then forming by low-pressure epitaxial growth an N type layer (not shown) as a collector layer to thickness of 0.5 μm containing phosphorus by 5E16 atoms/cm$^3$.

First, on the Si substrate 101, a thermal oxide film 102 with a thickness of about 90 nm and a boron-doped P$^+$ type poly-crystal Si layer 103 are adhered sequentially in this order, then an opening is formed in the active region, and then a silicon nitride film 104 is formed and undergoes anisotropic etching to thereby form a silicon nitride film SW105, which provides a side wall. The adjacent silicon nitride films SW105 such as shown in FIG. 2A are supposed to have an opening width of 0.4 μm therebetween.

Next, using the silicon nitride film 104 and the silicon nitride film SW105 as a mask, ions are injected beforehand to increase the phosphorus concentration directly below the active base. By doing so, it is possible to suppress a phenomenon (the Kirk effect) that the cut-off frequency of a transistor decreases when its collector current increases, thus obtaining a higher cut-off frequency with a larger current value.

Next, the wafer surface is completely cleared of a natural oxide film by washing it with diluted hydrofluoric acid (HF) to then carry out the subsequent steps using an epitaxial growth apparatus. Although the apparatus may be of Ultra-High-Vacuum Chemical Vapor Deposition (UHV-CVD), the present embodiment employs an apparatus of low-pressure CVD for controlling the concentrations of oxygen and water down to 10 ppb or less on the basis of hydrogen. First, the wafer is annealed in a hydrogen atmosphere at 900° C. for five minutes. The purpose of this annealing treatment is to completely remove a minute amount of an oxide film formed on the Si surface from oxygen and water minutely present when the wafer is loaded from a carrier chamber into a process chamber.

Next, the wafer temperature is lowered to 650° C. to grow an N type Si-Ge layer 106. In this case are introduced di-chloro-silane (SiH$_2$Cl$_2$) as a Si source gas, germanium hydride (GeH$_4$) as a Ge source gas, phosphorus hydride (PH$_3$) as an N type doping gas, and diborane (B$_2$H$_6$) as a P type doping gas. Furthermore, to preserve growth selectivity of the silicon nitride film and the silicon oxide film, hydrogen chloride is also introduced. These gases are all purified before being used by controlling the concentrations of oxygen and water down to 10 ppb or less.

Figure 2B:
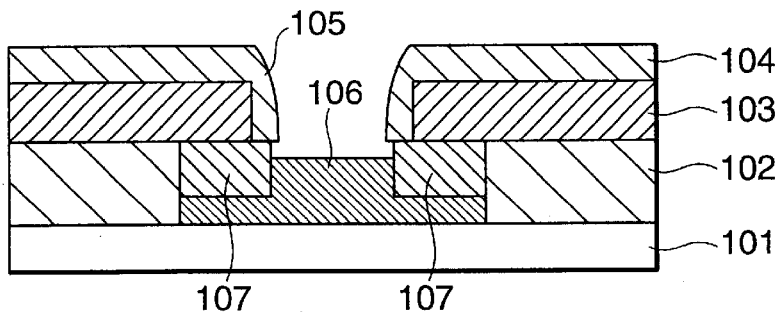
FIG. 2B is a cross-sectional view for showing the transistor according to the first embodiment of the present invention after a Si-Ge (or Si-Ge-C) layer is grown.
Figure 2C:
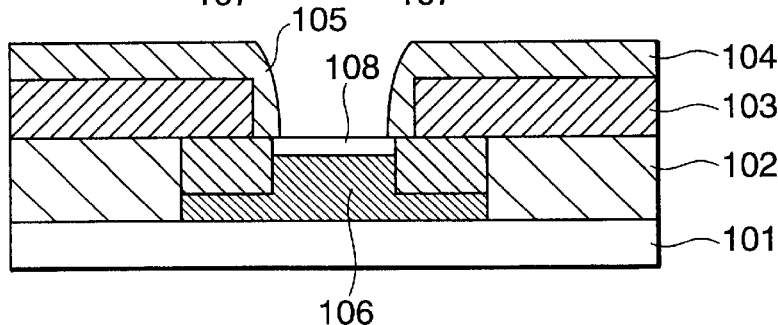
FIG. 2C is a cross-sectional view for showing the transistor according to the first embodiment of the present invention after single-crystal Si is grown.

The concentration of Ge in the Si-Ge layer is set at 20% and, to give a gradient in the Ge concentration, a gas flow of GeH$_4$ is gradually decreased when it is being generated. Under these conditions, Ge is grown at a growth rate of about 20 nm/minute for its concentration of 20% and is grown for about two minutes for its uniform concentration to thereby grow the Si-Ge layer 106 to thickness of 40 nm. By this step, poly-crystal Si is grown also on the boron-doped P$^+$ type poly-crystal Si layer 103 to form a base link portion diffusion layer 107 (FIG. 2B). Then, the temperature is raised to 700° C. to grow Si selectively. It is grown at a growth rate of about 2 nm/minute for five minutes to form a non-doped single-crystal Si layer 108 to thickness of 10 nm (FIG. 2C).

Figure 2D:
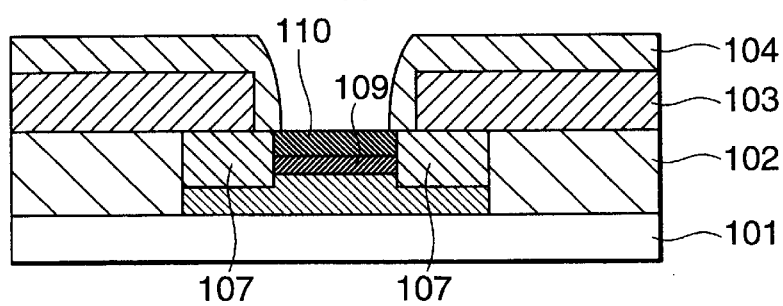
FIG. 2D is a cross-sectional view for showing the transistor according to the first embodiment of the present invention after boron is diffused.

Next, the temperature is raised to 780° C. to then perform diffusion on the surface of the single-crystal Si layer 108 in a low-pressure hydrogen atmosphere containing B$_2$H$_6$ by 0.3 ppm or so. As a result, boron is segregated on the surface of the Si-Ge layer 106 to form a high-concentration layer of boron expected to become an intrinsic base 109 and also to transform the above-mentioned single-crystal Si layer 108 into a boron-diffused layer 110 having a lower concentration. Upon completion of these consecutive processing steps, the wafer is unloaded from the epitaxial growth apparatus (FIG. 2D). Then, the wafer undergoes Rapid Thermal Oxidation (RTO) at 800° C. to thermally oxide the exposed Si surface to 10 Å or so. This Si surface is thus oxidized thermally because it has an emitter-base junction end expected to be formed thereon and so must be stable free of a defect.

Figure 2E:
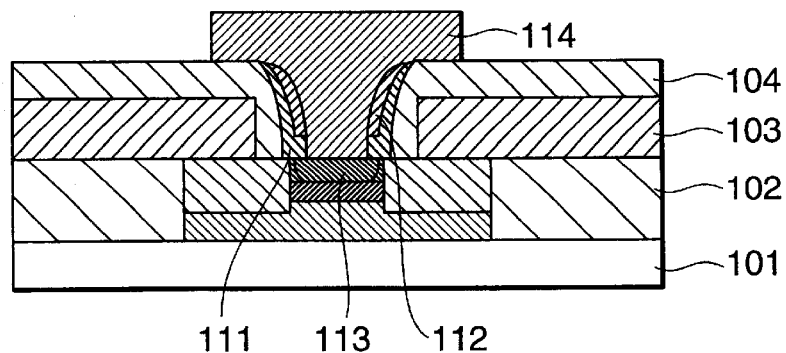
FIG. 2E is a cross-sectional view for showing the transistor according to the first embodiment of the present invention after an emitter electrode is formed.

Next, a CVD oxide film 111 is formed throughout the surface to thickness of 40 nm or so and then poly-crystal Si is form to thickness of 100 nm or so. Then, anisotropic etching is performed to leave this poly-crystal Si in a shape of side wall (SW) to provide a SW poly-crystal Si 112. Furthermore, the CVD oxide film left in the opening is removed by anisotropic etching to expose the surface of the epitaxial Si layer. Then, N$^+$ type poly-crystal Si into which phosphorus is doped throughout on the surface at 1E21 atoms/cm$^3$ is formed to thickness of 200 nm to process an emitter electrode subsequently, thus forming the intrinsic base 109 and an intrinsic emitter 113 finally (FIG. 2E). Then, an insulation film and a contact hole are formed to go to a step of wiring.

Note here that the N type Si layer may be grown epitaxially before the Si-Ge film is grown. This is because rather than direct hetero-growth on the substrate, an epitaxial Si layer should preferably be put as a buffer layer. It needs to be formed only to film thickness of 10 nm. Also, such a profile structure may be employed that at the time of Si-Ge growth directly following it, the Ge concentration is continuously increased until the layer is formed to 10 nm or so. The purpose is to suppress stress from being concentrated to specific interface.

It is thus possible to realize a double poly-crystal silicon type self-alignment transistor with a base width in the active region of 25 nm or less and a peak boron concentration of 1E20 atoms/cm$^3$ or so. This transistor decreases not only $\tau_F$ and base resistance values but also a variety of parasitic capacitance and parasitic resistance values, thus obtaining transistor performance of $f_{Tmax}$ and $f_{max}$ both being 150 GHz or higher.

Furthermore, it is possible to obtain manufacturing reproducibility for high transistor performance for the following two reasons. First reason is that emitter-base junction and hetero-junction can agree with each other in an self-alignment manner. That is, a hetero-junction interface between Si and Si-Ge is segregated at this hetero-interface. Boron is higher in concentration in Si-Ge, while phosphorus is lower oppositely. As such, if boron is diffused from the surface of the cap Si layer, the boron concentration rapidly increases at this interface position. If phosphorus is similarly diffused at a higher concentration, on the other hand, the concentration rapidly decreases at the hetero-interface. This phenomenon can be utilized so that the hetero-junction position and the PN-junction position may agree with each other in position accurately. The larger the segregation level, the more can be absorbed the process-wise fluctuations in thermal processing and film thickness, thus improving stability necessary to preserve manufacturing reproducibility.

The second reason is that a base layer is not grown into which boron has been doped at the time of epitaxial growth of Si-Ge. The Si-Ce epitaxial growth rate and the Ge composition are very sensitive to such factors as a growth temperature, a GeH$_4$ flow rate, etc. Also the behavior of selective growth varies with a pattern area ratio of a growing region on the wafer. Under such conditions, it is difficult to form a base profile with a size of 10 nm or so with good reproducibility at the time of growth. To guard against this, a base impurity can be diffused thermally from the surface, thus uniformly forming a doping region in a stable manner and free of pattern dependency.

Furthermore, as known already, by a method of diffusing boron from a high-purity hydrogen atmosphere containing B$_2$H$_6$, the conditions can be set optimally to sufficiently diffuse boron even with a surface boron concentration of 1E21 atoms/cm$^3$ or so at an extremely steep gradient to a depth of, for example, 30 nm or so at 800° C. or less. The process factors to be accurately controlled in this method are only the temperature and the partial pressure of B$_2$H$_6$, thus making it easy to obtain high reproducibility than that by boron doping at the time of epitaxial growth of Si-Ge.

Second Embodiment

Figure 4:
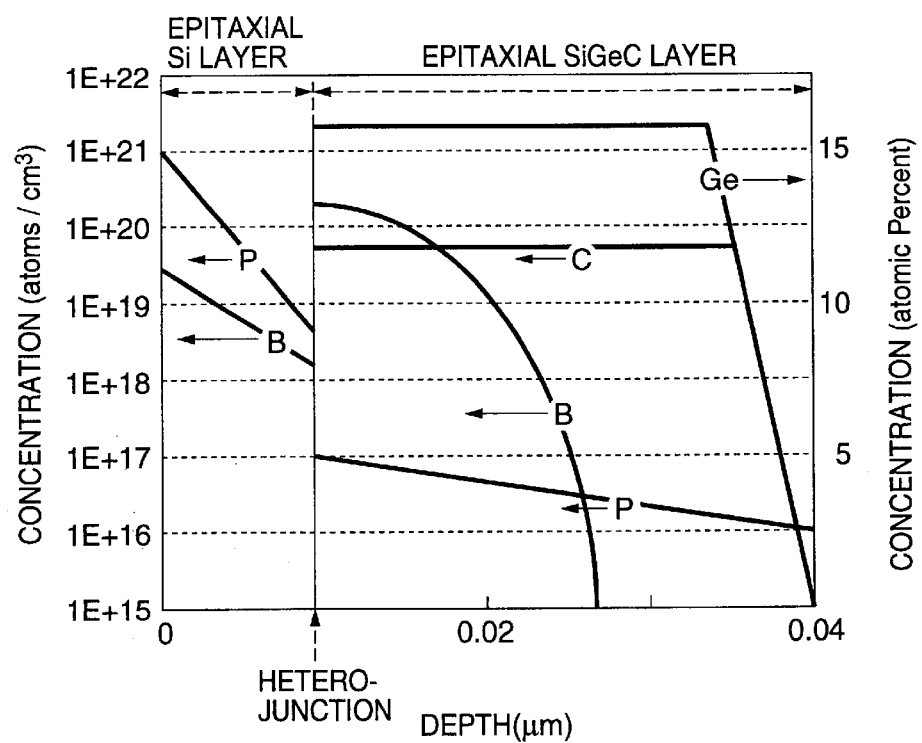
FIG. 4 is a graph for showing a concentration profile structure of a transistor junction according to a second embodiment of the present invention.

A profile structure of a bipolar transistor active portion formed by the second embodiment is shown in FIG. 4. The second embodiment differs from the first embodiment in that the base layer is made not of Si-Ge but of a Si-Ge-C with carbon (C) contained at 5E19 atoms/cm$^3$. C is added so that boron may be segregated more at the hetero-junction interface.

The segregation phenomenon occurs for a few reasons, a main one of which may be a difference in diffusion rate (diffusion coefficient). The main mechanism of diffusion of boron is a diffusion model by way of a vacancy, so that the diffusion coefficient decreases if C is arranged at a majority of vacancies. As such, boron is segregated at an interface between Si having a large diffusion coefficient and Si-Ge-C having a small diffusion coefficient. By the way, reportedly it is possible to arrange almost all of the C molecules at the vacancies by performing epitaxial growth at 650° C. or less.

When diffused into such materials, boron is diffused fastest into Si, next fastest into Si-Ge, and slowest into Si-Ge-C. In. Si-Ge-C to which C is added according to the present embodiment, therefore, boron is segregated more effectively than in Si-Ge, thus further improving the stability at which an emitter-base junction position is established. Furthermore, this effect makes it possible to increase the in-the-base boron concentration at the same in-the-emitter boron concentration in order to result in a narrower base layer with higher concentration as accompanied by the effect of suppressing boron from being diffused into the Si-Ge-C layer, thus further improving the high-speed performance of the transistor. Furthermore, it makes it possible to suppress deterioration in performance against heat, which is a problem in the satisfying of requirements for, for example, a wider applications such as Bi-CMOS and other devices.

A method for manufacturing a transistor having a profile structure according to the present embodiment is the same as that of the above-mentioned first embodiment except that the Si-Ge layer forming step is replaced by the Si-Ge-C layer forming step and, therefore, is omitted in explanation.

Third Embodiment

Figure 5:
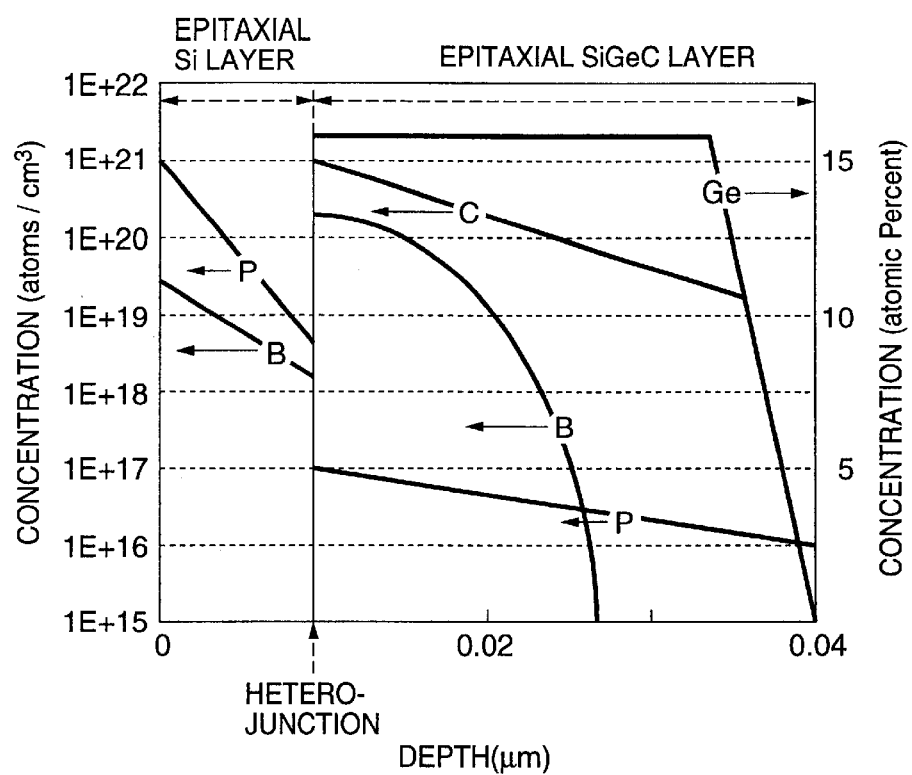
FIG. 5 is a graph for showing a concentration profile structure of a transistor junction according to a third embodiment of the present invention.

A profile structure of a bipolar transistor active portion formed according to the third embodiment of the present invention is shown in FIG. 5. In the present embodiment, the carbon (C) profile in the second embodiment is inclined. The concentration is 1E19 atoms/cm$^3$ near the base-collector junction and 5E20 atoms/cm$^3$ near the emitter-base junction. The C concentration is thus given a gradient to give rise to an electric field in the base, thus accelerating a carrier. Si has a band gap of 1.1 eV and a lattice constant of 5.4 Å, while C has a band gap of 5.6 eV and a lattice constant of 3.6 Å. As the C concentration increases in Si, its lattice constant decreases and its band gap increases. In a case where stress is relaxed (in the case of cubic lattice), the band gap is +45 meV/carbon% and the lattice constant is −0.018 Å/carbon%, which is tantamount to a potential difference of about 41 mV in the first embodiment. The actual value, however, is larger because the crystal has a tetrahedral structure with no stress relaxed on the interface.

The largest merit of thus generating an internal electric field not by use of Ge but by use of C is improvement in stability of steps. That is, the growth rate of the Si-Ge layer is extremely dependent on a flow rate of $GeH_4$ used as a Ge source gas and so rapidly increases as the concentration increases. Its growth temperature is also sensitive. As a result, to form a base profile accurately, the process parameters need to be highly reproducible and stable. $SiCH_6$ used as a C source gas, on the other hand, has a negligible effect on the growth rate. As a result, it is possible to obtain almost the same carrier acceleration effect of an internal electric field as that by gradient Ge while improving process reproducibility.

A method for manufacturing a transistor having a profile structure according to the present embodiment is the same as that of the above-mentioned second embodiment except that the profile structure has a gradient C concentration in Si-Ge-C.

Fourth Embodiment

Figure 6:
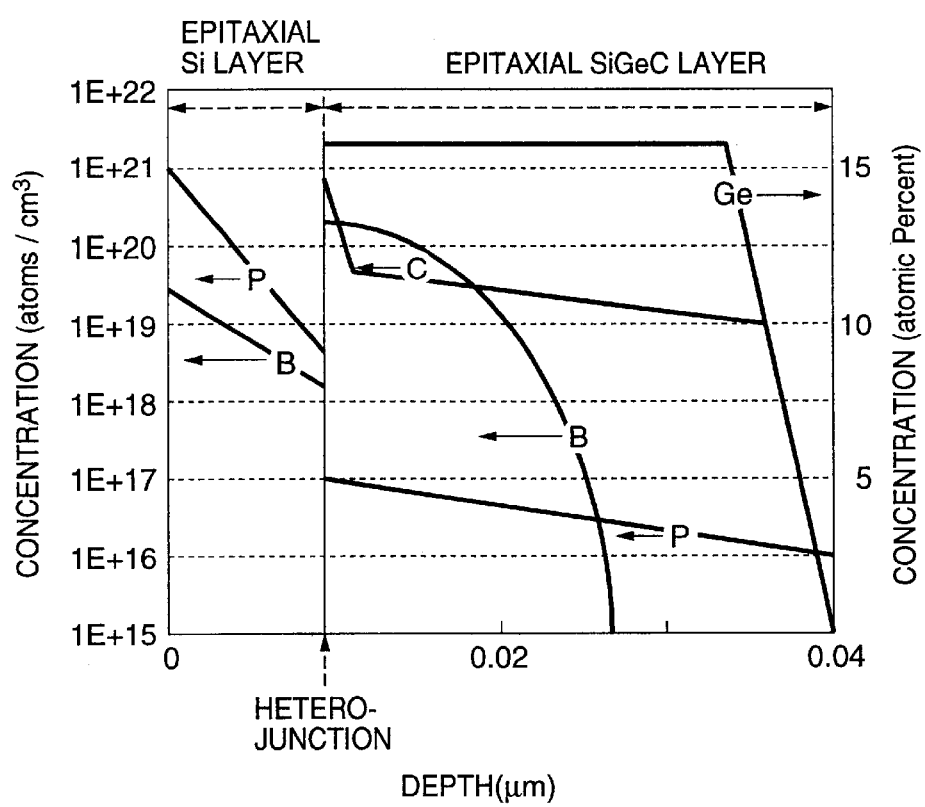
FIG. 6 is a graph for showing a concentration profile structure of a transistor junction according to a fourth embodiment of the present invention.

A profile structure of a bipolar transistor active portion formed according to the fourth embodiment of the present invention is shown in FIG. 6. According to the present embodiment, the profile structure is such that the carbon (C) concentration in the second or third embodiment rapidly increases on the surface of the Si-Ge-C layer. The C concentration is 1.5% at an interface between Si and Si-Ge-C and continuously increases from 0.1% within a range of 5 nm or so in the depth direction.

If the segregation effect of boron at the interface between the Si layer and the Si-Ge-C layer is utilized, this interface may encounter stress due to mismatch in lattice constant, to be partially disengaged in bond, thus giving rise to stress relaxation. This may possibly result not only in a crystal defect but also in a fluctuation in characteristics of the reliability. It is, therefore, an effective solution to suppress mismatch in lattice constant on this interface as much as possible. For example, if the Ge composition ratio is 15%, a lattice constant mismatch of 0.03 Å or so occurs, whereas if the C concentration in this region is 1.56%, the lattice constants match with each other, with no stress being generated. By continuously changing this C composition ratio near the surface of the Si-Ge-C layer, it is possible to relax stress not in two dimensions but in three dimensions, thus providing an effect of suppressing the stress from being concentrated.

A conventional method just to relax mismatch has been to continuously change the Ge composition ratio near the junction. This method, however, cannot be employed in the series of embodiments of the present invention because they utilize the segregation phenomenon occurring at a heterojunction interface. By increasing the C composition ratio, however, mismatch in lattice constant can be suppressed continuously, thus further enhancing the segregation effect.

A method for manufacturing a transistor having a profile structure according to the present embodiment is the same as that of the above-mentioned third embodiment except that the profile structure has a rapid increase in C concentration on the surface of the Si-Ge-C layer.

Fifth Embodiment

Figure 7A:
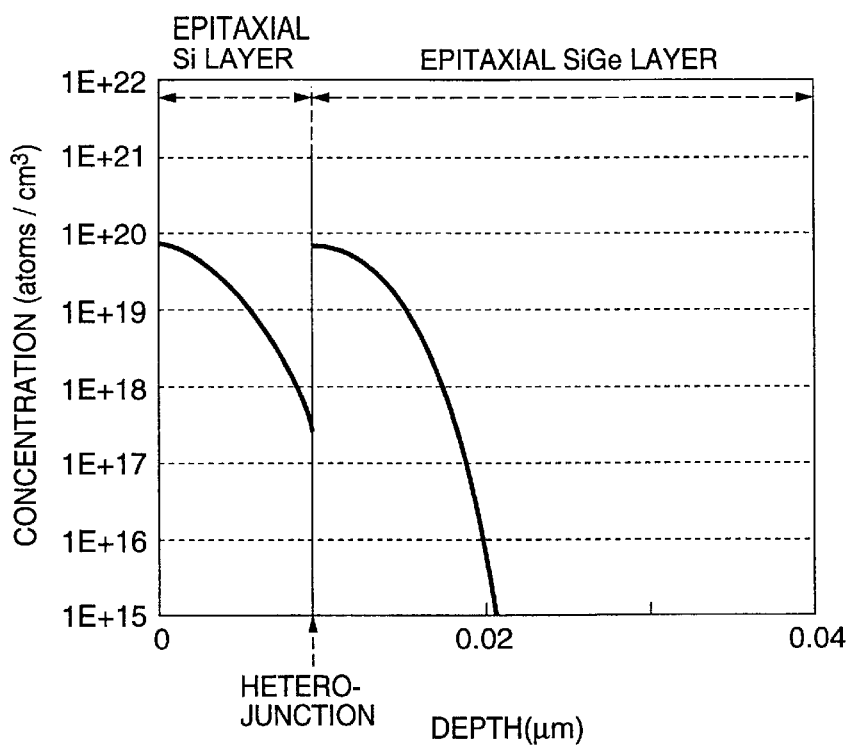
FIG. 7A is a graph for showing a simulated boron concentration profile of a transistor junction according to a fifth embodiment of the present invention immediately after boron is diffused and FIG. 7B is a graph for showing the simulated boron concentration profile of the transistor junction according to the fifth embodiment of the present invention after annealing.
Figure 7B:
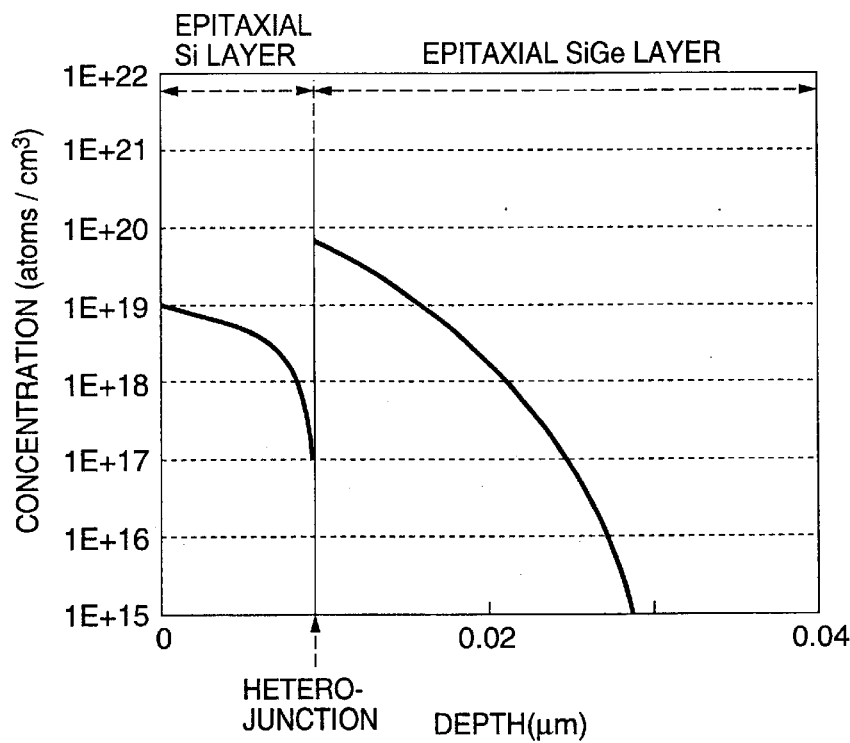

The fifth embodiment has additional 20-minute annealing treatment performed at about 800° C. following diffusion in the step of diffusion from a $B_2H_6/H_2$ atmosphere for formation of a high-concentration base layer of the first through fourth embodiments. Simulated boron concentration profiles of a transistor junction according to the fifth embodiment of the present invention before and after annealing are shown in FIGS. 7A and 7B. Based on these figures, it is confirmed that the surface concentration of boron decreases after annealing.

In diffusion from the $B_2H_6/H_2$ atmosphere, $SiB_3$ is formed on the top surface in some cases. Since the top surface has an extremely high boron concentration, the boron concentration may possibly be higher than the phosphorus concentration finally, in which case the transistor cannot operate normally. To solve this problem, the present embodiment performs annealing immediately after boron is diffused, to reduce the surface concentration.

Sixth Embodiment

Figure 8A:
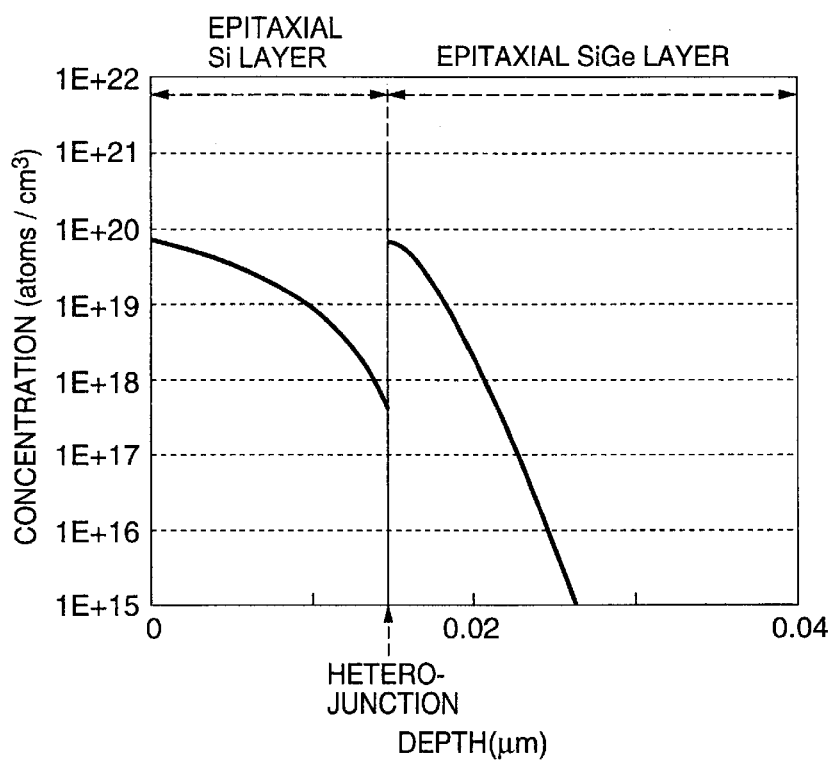
FIG. 8A is a graph for showing a simulated boron concentration profile of a transistor junction according to a sixth embodiment of the present invention after boron is diffused and FIG. 8B is a graph for showing a simulated boron concentration profile of the transistor junction according to the sixth embodiment of the present invention after surface etching.
Figure 8B:
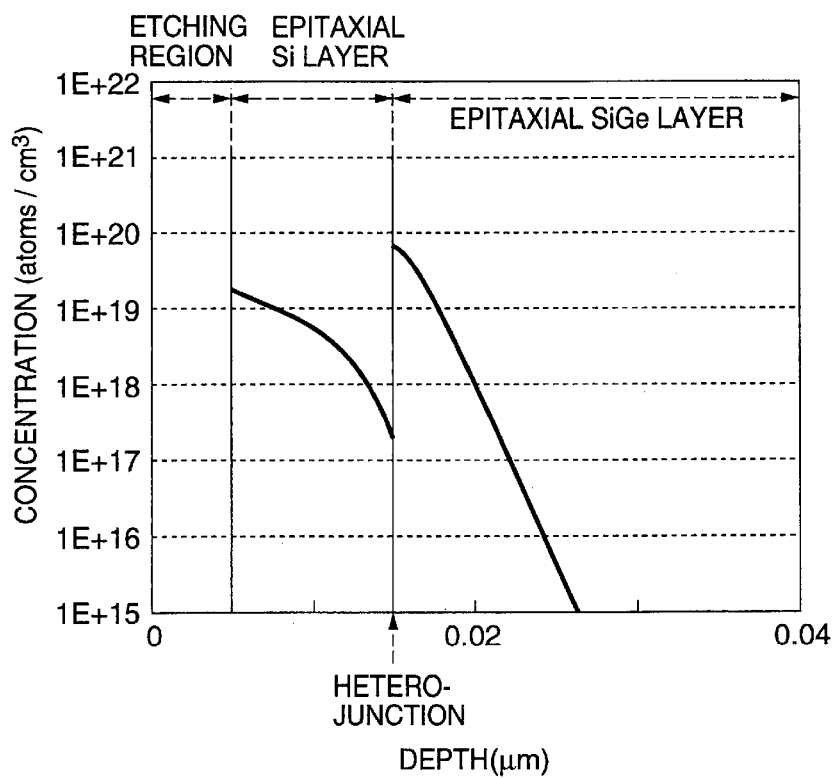

Similar to the fifth embodiment, the sixth embodiment also has a process for preventing the boron concentration in the top surface region from exceeding the phosphorus concentration during diffusion from a $B_2H_6/H_2$ atmosphere. After $B_2H_6$ is diffused, in an atmosphere containing a carrier gas and HCl, the top surface of the cap Si layer is etched off as much as 5 nm or so. In this case, the epitaxial layer thickness of the cap Si layer is supposed to be 15 nm. A simulated boron concentration before and after etching is shown in FIGS. 8A and 8B.

The present embodiment makes it possible to remove a high-concentration region on the top surface in consecutive processes in an apparatus for growing layers, in order to remove an unnecessary boron diffusion source and also enhance the predominance of the phosphorus concentration in the emitter. Furthermore, an etching rate can be controlled by adjusting the partial pressure of HCl, thus performing processing in short time.

Seventh Embodiment

Figure 9A:
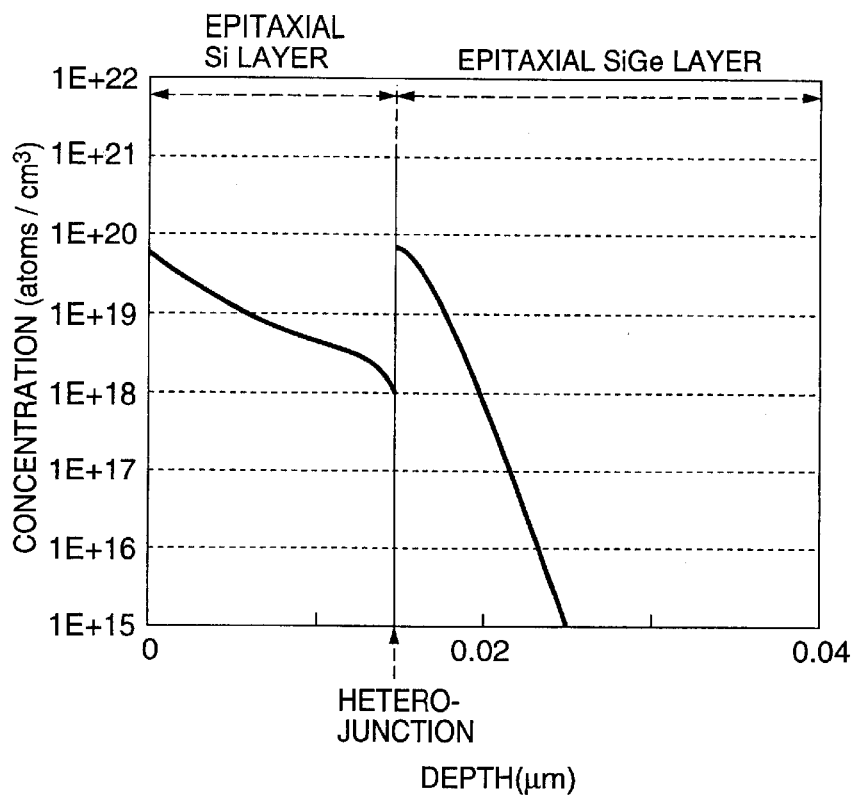
FIG. 9A is a graph for showing a simulated boron concentration profile of a transistor junction according to a seventh embodiment of the present invention immediately after boron is diffused and FIG. 9B is a graph for showing the simulated boron concentration profile of the transistor junction according to the fifth embodiment of the present invention after an oxide film is removed and an emitter electrode is formed.
Figure 9B:
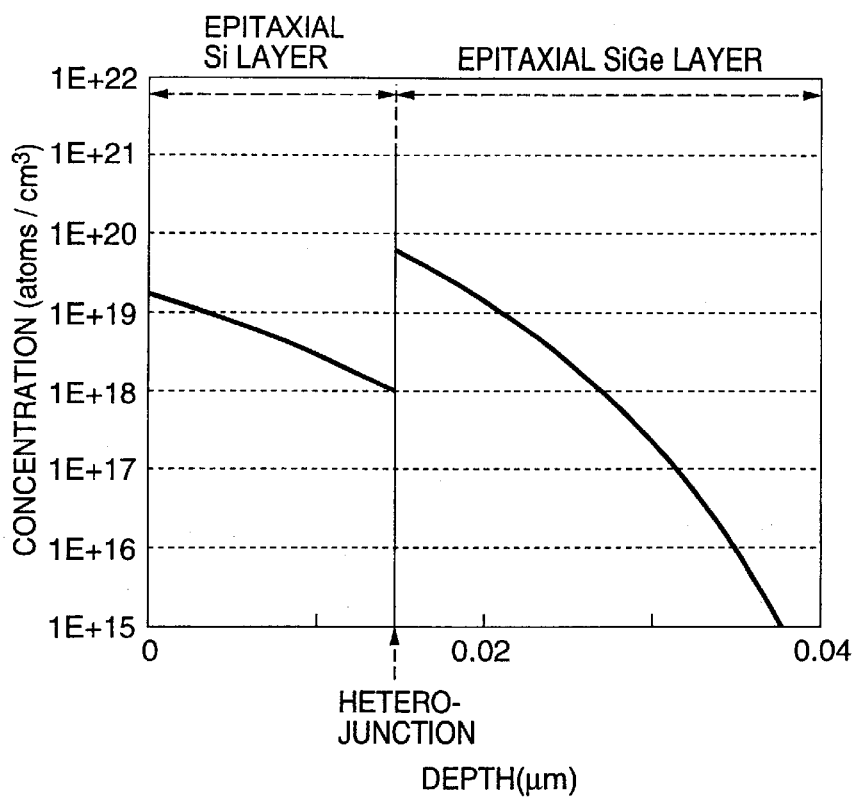

Similar to the fifth and sixth embodiments, the seventh embodiment also has the process for preventing the boron concentration in a top surface region from becoming higher than the phosphorus concentration owing to diffusion from a $B_2H_6/H_2$ atmosphere. First, in methodology, after $B_2H_6$ is diffused, for example, the surface is oxidized as much as 3 nm in an oxygen atmosphere at about 750° C., thus forming a sacrificial oxide film. Then, diluted HF is used to etch the sacrificial oxide film, thus removing the high-concentration region on the surface. Simulated boron concentration profiles after boron is diffused and after an emitter electrode is formed are shown in FIGS. 9A and 9B respectively.

By the present embodiment, after the step of diffusing $B_2H_6$, a top surface region in which $SiB_3$ is formed is oxidized through heat treatment to provide a sacrificial oxide film, which is then etched off. The present embodiment makes it possible to accurately control the film thickness of the sacrificial oxide film, thus removing the high-concentration region on the surface with good reproducibility.

Eighth Embodiment

FIGS. 10 show cross-sectional flow diagrams of the eighth embodiment. The present embodiment has improved the base link portion forming method in the first through seventh embodiments. First, the present embodiment is the same as the first embodiment in manufacturing method up to the step of forming a side wall of the silicon nitride film. Then, an N type epitaxial Si 1001 is grown to 50 nm on the Si substrate. At this point in time, a P type poly-crystal Si 1002 has grown also from an exposed portion of the poly-crystal base electrode to link with the N type epitaxial Si 1001 (FIG. 10A). In this state, annealing treatment is performed in an epitaxial growth apparatus at 900° C. for five minutes to provide a P type link base diffusion layer 1003 up to a substrate surface where a link portion is in contact with another (FIG. 10B).

Figure 10A:
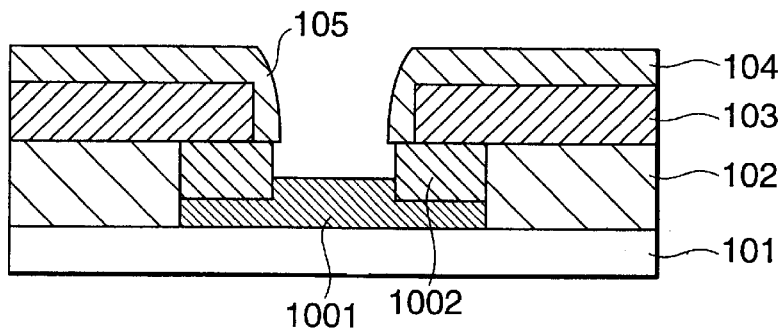
FIG. 10A is a cross-sectional view for showing a transistor according to an eighth embodiment of the present invention after a nitride film side wall is formed and a Si layer is grown.
Figure 10B:
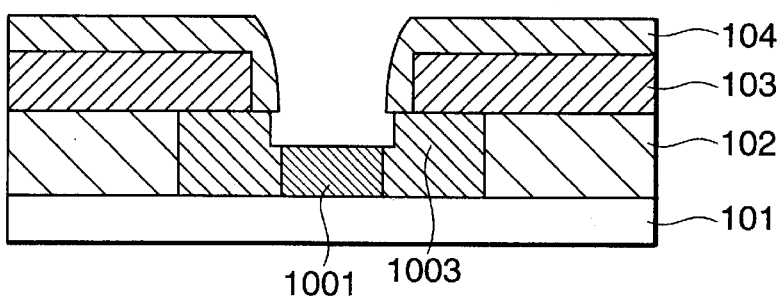
FIG. 10B is a cross-sectional view for showing the transistor according to the eighth embodiment of the present invention after annealing.
Figure 10C:
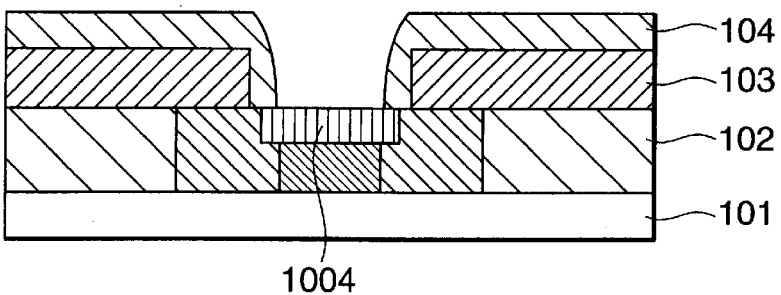
FIG. 10C is a cross-sectional view for showing the transistor according to the eighth embodiment of the present invention after a Si-Ge (or Si-Ge-C) layer is grown.
Figure 10D:
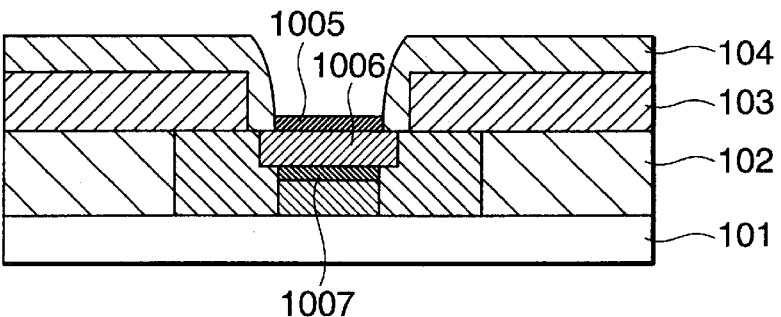
FIG. 10D is a cross-sectional view for showing the transistor according to the eighth embodiment of the present invention after a Si layer is grown.

Next, the temperature is lowered to then grow a Si-Ge (or Si-Ge-C) N type epitaxial layer 1004 as much as 300 Å (FIG. 10C). Consecutively, a cap Si epitaxial layer 1005 is grown. The subsequent steps are the same as those of the first embodiment in that boron is diffused to form an active base 1006 and also that a Si-Ge (or Si-Ge-C) N type epitaxial layer 1004 is transformed into a P type Si-Ge (or Si-Ge-C) layer 1007 (FIG. 10D). It is thus possible to securely transform the P type link base layer 1003 into a high-concentration P type region, thus reducing a base resistance ascribed to this portion. Furthermore, the collector-base junctions are all formed in the Si substrate region, thus obtaining good DC characteristics of the transistor including reverse characteristics.

Ninth Embodiment

FIGS. 11 show cross-sectional flow diagrams of the ninth embodiment. Similar to the eighth embodiment, the present embodiment optimizes a profile structure of the base link portion. In place of a wafer with surface orientation (100), a Si (111) substrate 1101 is used. The present embodiment uses the same method as that by the first embodiment, to form a structure shown in FIG. 11A. Then, the Si (111) substrate 1101 has a poly-crystal silicon layer formed thereon to 100 nm by low-pressure (LP) CVD and subsequently annealed at about 850° C. for a few minutes.

Then, utilizing high selectivity for the (111) surface, the poly-crystal silicon layer is removed in a potassium hydroxide (KOH) solution at about a temperature a little higher than 50° C. In this case, a poly-crystal Si link portion 1102 between the substrate and a poly-crystal base electrode is left non-removed by diffusion from the P$^+$ type poly-crystal Si layer 103 expected to become the base electrode. Simultaneously, on the surface of the Si (111) substrate 1101 also, a boron diffusion region 1103 is formed (FIG. 11B). The subsequent steps are the same as those by the first embodiment in that a boron layer expected to become an active base 1105 is formed on the surface of a Si-Ge (or Si-Ge-C) N type epitaxial layer 1104, on which a boron-diffused cap Si layer 1106 is formed. At the same time, however, a region 1107 where-boron is diffused into single-crystal is also formed (FIG. 11C).

Similar to the eighth embodiment, it is thus possible to transform the base link portion into a high-concentration p type portion, thus reducing the base resistance. Moreover, the link portion can be annealed without taking the effect of an active base portion into account. The profile structure of this portion has an influence not only on junction leakage of the transistor but also on the AC characteristics as a resistance component of the external base portions other than the intrinsic base. Although the junction capacitance increases, preferably the impurity is diffused deep as much as possible to reduce the resistance.

Tenth Embodiment

FIGS. 12 show cross-sectional flow diagrams of the tenth embodiment. First, a structure of FIG. 12A having no side wall of the silicon nitride film is formed. Then, pre-processing is performed, followed by annealing treatment performed in a high-purity hydrogen atmosphere in an epitaxial reactor at 900° C. for five minutes or so, after which are sequentially formed an N type epitaxial Si layer to 30 nm and an N type Si-Ge (or Si-Ge-C) layer 1201 to 40 nm at about 800° C. At the same time, a base link portion diffusion layer 1202 grows also from an exposed portion of the poly-crystal base electrode to link with the substrate (FIG. 12B).

Figure 12A:
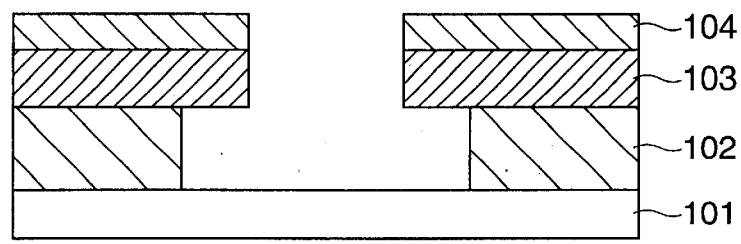
FIG. 12A is a cross-sectional view for showing a transistor according to a tenth embodiment of the present invention after a nitride film with no side wall is formed.
Figure 12B:
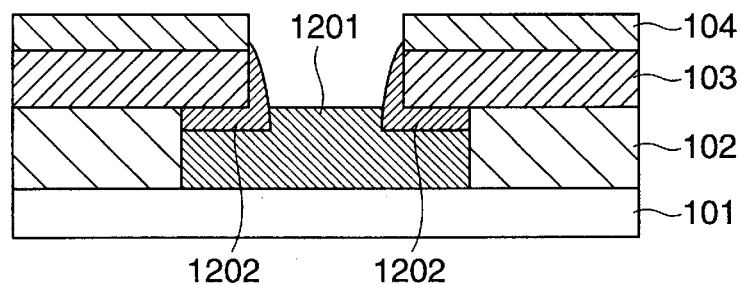
FIG. 12B is a cross-sectional view for showing the transistor according to the tenth embodiment of the present invention after a Si-Ge (or Si-Ge-C) layer is grown.
Figure 12C:
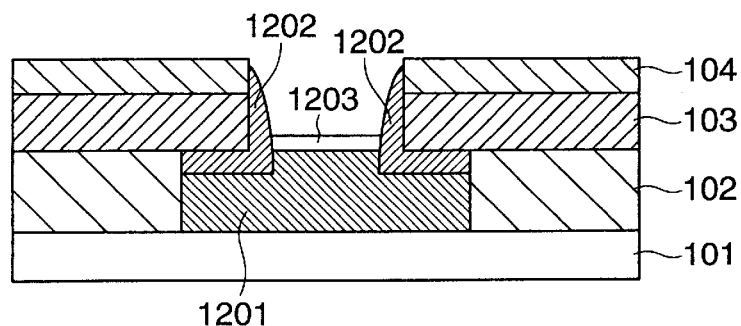
FIG. 12C is a cross-sectional view for showing the transistor according to the tenth embodiment of the present invention after a cap Si layer is grown.
Figure 12D:
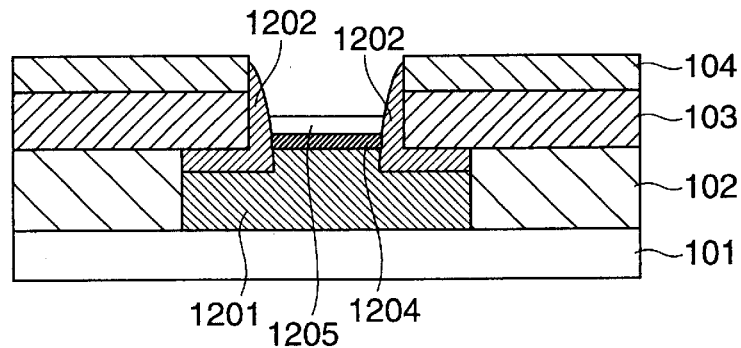
FIG. 12D is a cross-sectional view for showing the transistor according to the tenth embodiment of the present invention after boron is diffused and an intrinsic base layer is grown.

Next, the temperature is raised to about 800° C. or about 850° C. to subsequently perform annealing for a few minutes to a few tens of minutes to sufficiently diffuse boron from the link portion to the substrate. Then, a cap Si layer 1203 is epitaxially grown as shown in FIG. 12C. Similar to the first embodiment, an active base 1204 is formed by diffusion from a $B_2H_6/H_2$ atmosphere. At the same time, the cap Si layer 1203 is transformed into a P type Si layer 1205 (FIG. 12D).

Since in the first through ninth embodiments, a silicon nitride film is present on the side wall of the boron-doped poly-crystal Si, once the bottom of this nitride film is buried completely, selective growth progresses with the end as positioned on the side wall of the silicon nitride film. If the relative film thickness of the Si-Ge layer (or Si-Ge-C layer) becomes larger with respect to the thermal oxide film, such a situation develops immediately. In this case, by growing a cap Si and diffusing boron in a gaseous phase from the surface, a peripheral end of the emitter-base junction may possibly be formed at an interface between the silicon nitride film and the selective growth region. In such a case, good emitter-base junction characteristics cannot be obtained. Such a situation occurs if the relative film thickness of the thermal oxide film with respect to the Si-Ge or Si-Ge-C layer is set so as to be small. If selective growth is performed with no side wall present, the emitter-base junction is not formed on such an interface, so that the rate-determination relationship basically disappears between the film thickness of the thermal oxide film and that of the epitaxial growth film, thus improving the degree of freedom in design of the device.

Eleventh Embodiment

FIGS. 13 show cross-sectional flow diagrams of the eleventh embodiment. The present embodiment is the same as the first embodiment up to the step of epitaxially growing a Si-Ge (or Si-Ge-C) layer 1301 and a cap Si layer 1302 (FIG. 13A). Then, a protection oxide film 1304 is adhered to about 30 nm to subsequently inject boron using a low-energy ion injection apparatus under such conditions that an ion seed is $^{11}B^+$, injection energy is 500 eV, and a dosage is 2E15 atoms/cm$^2$ (FIG. 13B).

Next, for activation of the injection layer, the wafer is annealed at about 950° C. for 30 seconds to form an active base layer 1305 due to segregation of boron on the surface of the Si-Ge (or Si-Ge-C) layer and dope boron into the cap Si layer 1302 so that it may be transformed into a P type Si layer 1306 (FIG. 13C). A profile of the base layer on an ordinary Si (100) substrate formed by this step is such that the surface boron concentration is 2E20 atoms/cm$^3$ and the concentration reaches 1E17 atoms/cm$^3$ at a depth of about 30 nm.

By such an ion injection method, due to segregation, the intrinsic base layer 1302 having a higher boron concentration than the cap Si layer is formed on the surface of the Si-Ge (or Si-Ge-C) layer. Since the present embodiment employs the ion injection method instead of the diffusion method for doping of boron, it is possible to control the process at a high accuracy, to control the profile precisely, and also to improve reproducibility.

Twelfth Embodiment

Figure 14A:
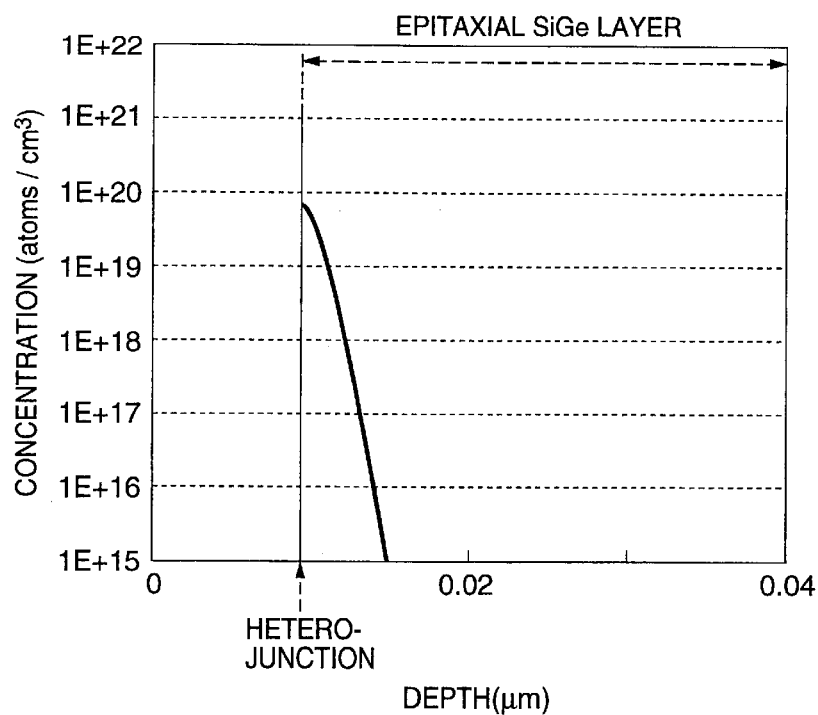
FIG. 14A is a graph for showing a simulated boron concentration profile of a transistor junction according to a twelfth embodiment of the present invention after boron is diffused and FIG. 14B is a graph for showing the simulated boron concentration profile of the transistor junction according to the twelfth embodiment of the present invention after an emitter electrode is formed.
Figure 14B:
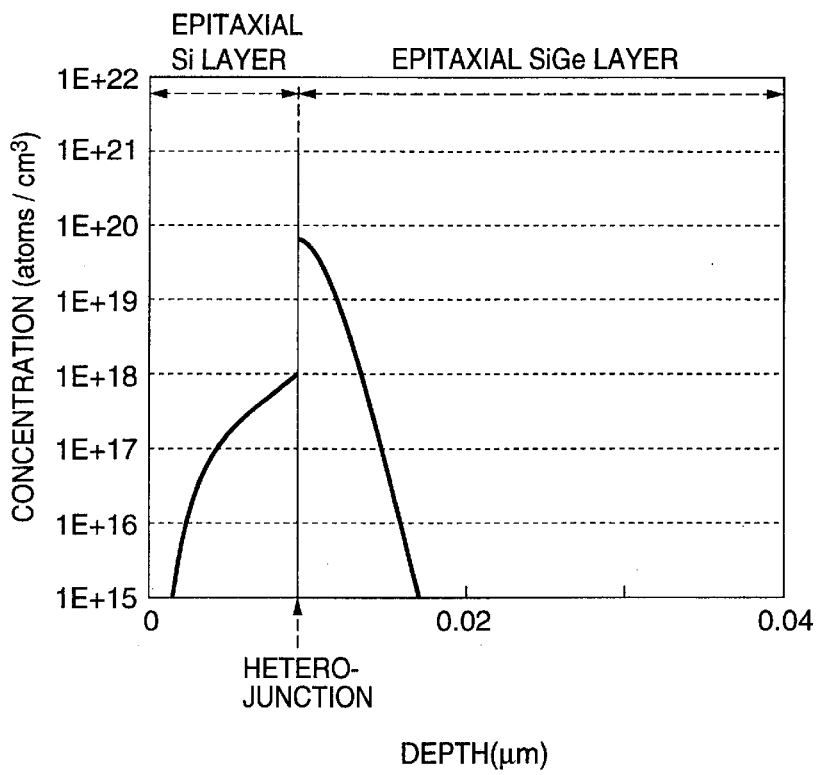

By the twelfth embodiment, a Si-Ge (or Si-Ge-C) layer is grown epitaxially and then boron is diffused from a $B_2H_6/H_2$ atmosphere. In this case, the partial pressure of $B_2H_6$ is controlled so as not to form a $SiH_3$ layer on the top surface. Then, a cap Si layer is grown epitaxially. Then, similar to the first embodiment, phosphorus-doped poly-crystal Si is grown to subsequently diffuse phosphorus by RTA, thus forming an active emitter region. Simulated boron concentration profiles after diffusion and after formation of the active emitter region are shown in FIGS. 14A and 14B.

Although it is not easy for the present embodiment to accurately control the peak concentration at 2E20 atoms/cm³ or so while controlling the partial pressure of $B_2H_6$ so as not to form the $SiH_3$ layer, the final base can be formed extremely thin.

Thirteenth Embodiment

Figure 15A:
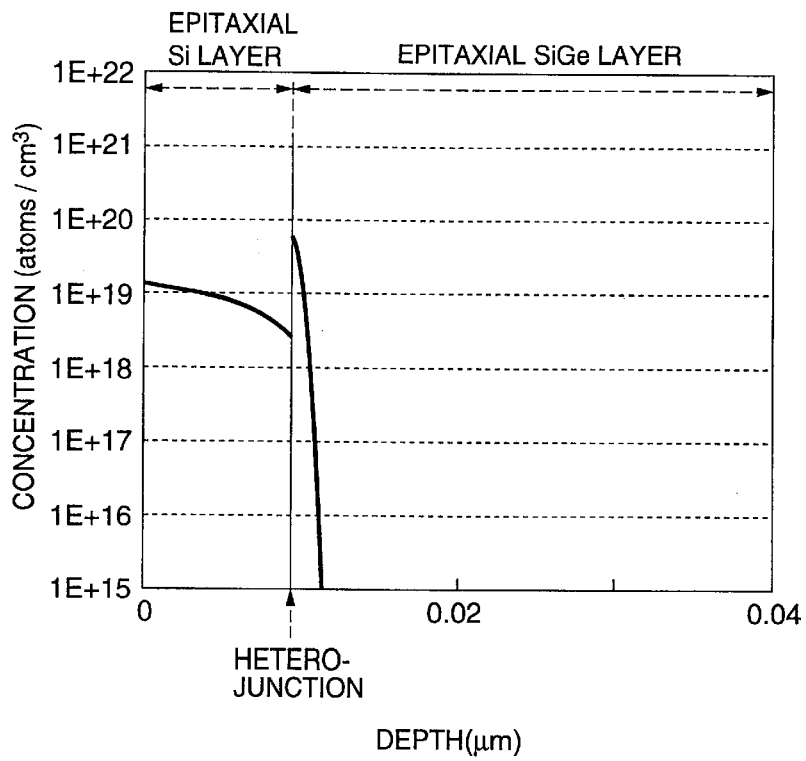
FIG. 15A is a graph for showing a simulated boron concentration profile of a transistor junction according to a thirteenth embodiment of the present invention after a cap P type Si layer is grown and FIG. 15B is a graph for showing the simulated boron concentration profile of the transistor junction according to the thirteenth embodiment of the present invention after an emitter electrode is formed.
Figure 15B:
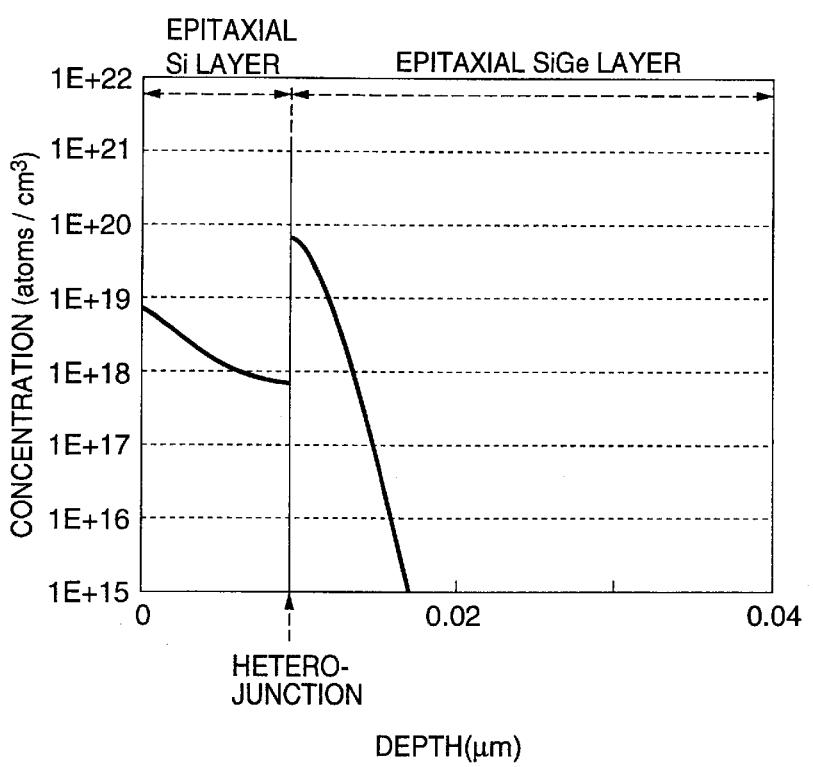

By the thirteenth embodiment, a Si-Ge (or Si-Ge-C) layer is grown epitaxially and, consecutively, a P type cap epitaxial Si layer with a boron concentration of 2E19 atoms/cm³ is grown to, for example, 100 Å. Further consecutively, the wafer is annealed in a hydrogen atmosphere at 800° C. for 30 minutes to diffuse boron into the surface of the Si-Ge (or Si-Ge-C) layer. In this step, the boron concentration in the cap Si layer decreases due to segregation to such a level lower than that at the Si-Ge (Si-Ge-C) interface. A simulated boron concentration profile before and after annealing is shown in FIGS. 15A and 15B. Then, finally an emitter is formed by diffusion from phosphorus-doped poly-crystal Si.

Figure 16:
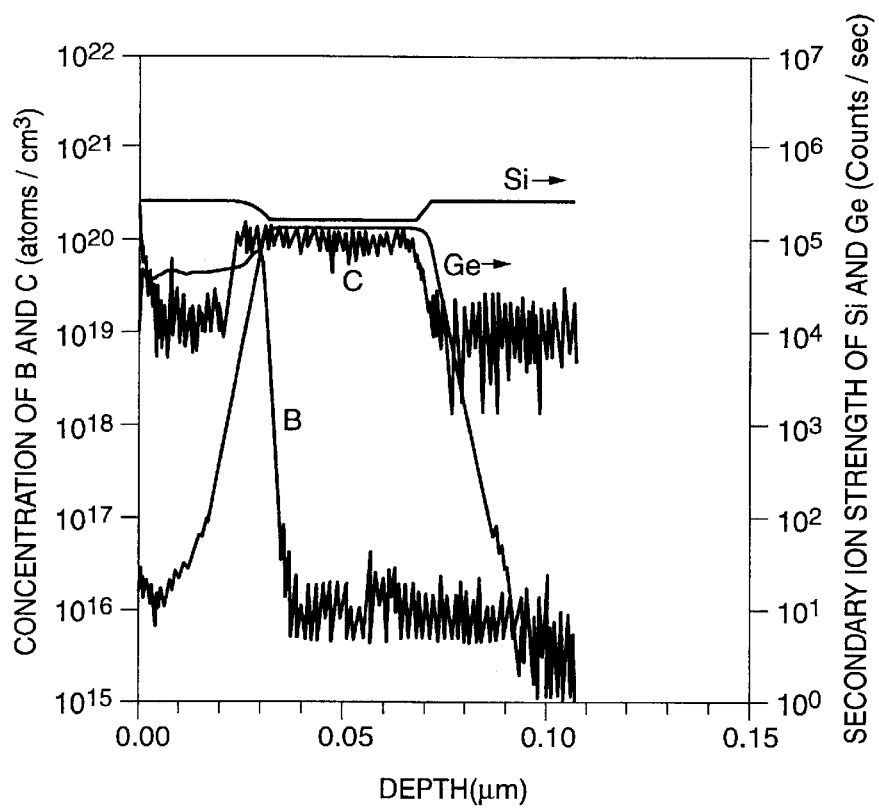
FIG. 16A is a graph for showing a profile structure of an SIMS result of a transistor junction actually manufactured according to the thirteenth embodiment of the present invention after a cap P type Si layer is grown and FIG. 16B is a graph for showing a profile structure of an SIMS result of the transistor junction actually manufactured according to the thirteenth embodiment of the present invention after an emitter electrode is formed.
Figure 16:
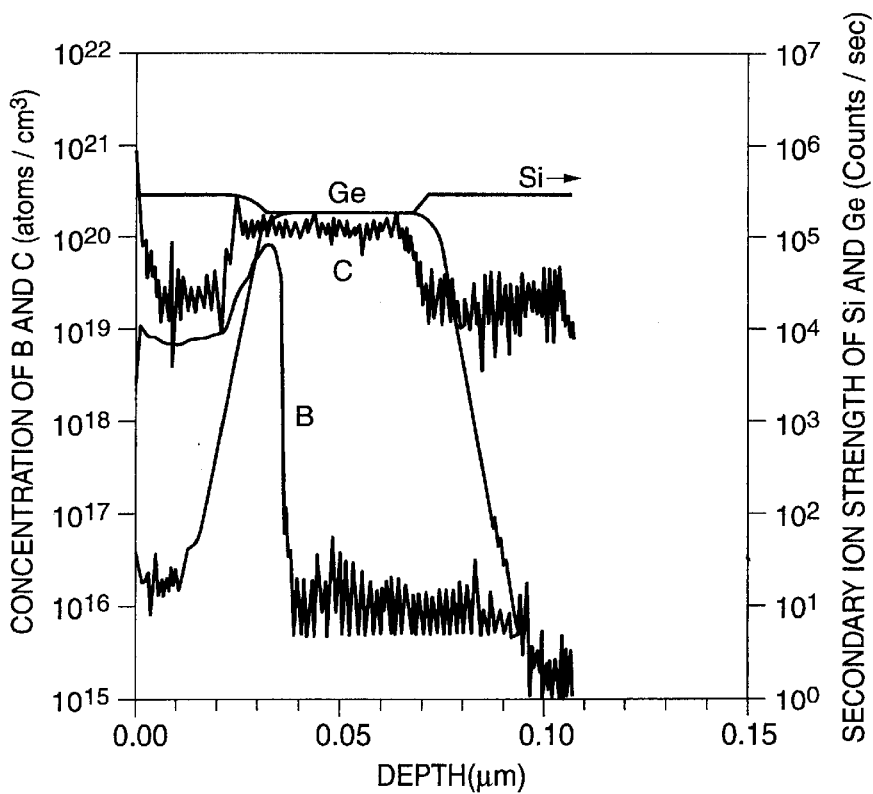

FIGS. 16A and 16B show results, before and after annealing respectively, of conducting SIMS (Secondary Ion Mass Analysis, by which a minute amount of an impurity element in a specimen is analyzed in the depth direction) of a transistor actually manufactured by epitaxially growing a Si-Ge-C layer, then growing a P type epitaxial Si layer of a boron concentration of about 2E19 atoms/cm³ to 200 Å, and then annealing it. As can be seen from these figures, almost the same results are obtained as those simulated.

By the present embodiment, instead of diffusing boron from a $B_2H_6/H_2$ atmosphere, high-concentration boron is epitaxially grown onto the cap Si layer and annealed to obtain by segregation a high-concentration base layer having an extremely small base width of 10 nm or so, with the peak carrier concentration being in excess of 1E20 atoms/cm³. Since the diffusion method is not used, $SiB_3$ is not formed on the top surface.

Fourteenth Embodiment

FIGS. 17 show cross-sectional flow diagrams of the fourteenth embodiment. Similar to the first embodiment, by the present embodiment, boron is diffused from a $B_2H_6/H_2$ atmosphere to complete initial doping to an intrinsic base portion, as shown in FIG. 17A. In the figure, a reference numeral 1601 indicates an N type epitaxial Si layer, a reference numeral 1602 indicates a thermal oxide film, a reference numeral 1603 indicates a Pi type poly-crystal Si, a reference numeral 1604 indicates a silicon nitride film, a reference numeral 1605 indicates a silicon nitride SW, a reference numeral 1606 indicates an N type Si-Ge (or Si-Ge-C) epitaxial growth layer, a reference numeral 1607 indicates a Si-Ge (or Si-Ge-C) link base diffusion layer, a reference numeral 1608 indicates an active base layer, and a reference numeral 1609 indicates an epitaxial Si layer.

Figure 17A:
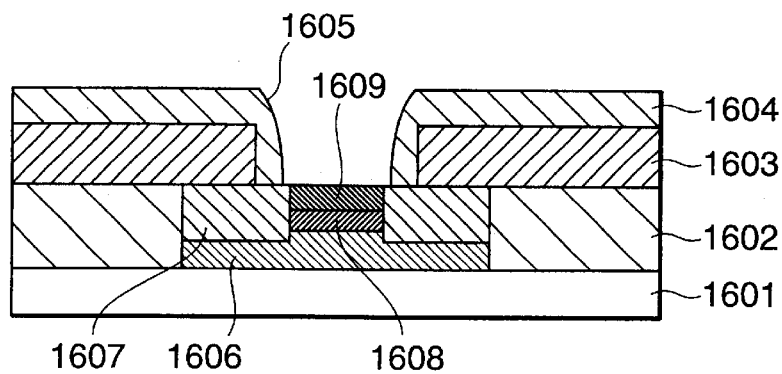
FIG. 17A is a cross-sectional view for showing a transistor according to a fourteenth embodiment of the present invention after an active base layer is formed.
Figure 17B:
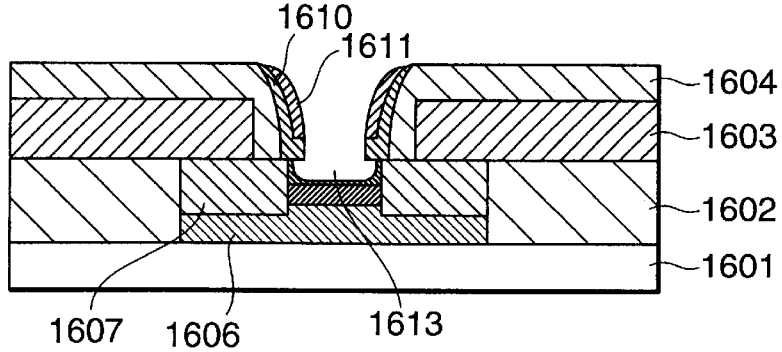
FIG. 17B is a cross-sectional view for showing the transistor according to the fourteenth embodiment of the present invention after side walls of a CVD oxide film and a CVD poly-crystal Si layer are formed and an emitter region is etched.
Figure 17C:
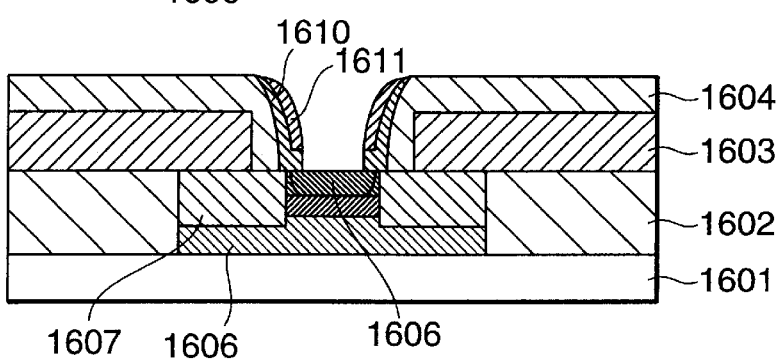
FIG. 17C is a cross-sectional view for showing the transistor according to the fourteenth embodiment of the present invention after an N type Si layer is grown in an emitter layer.
Figure 17D:
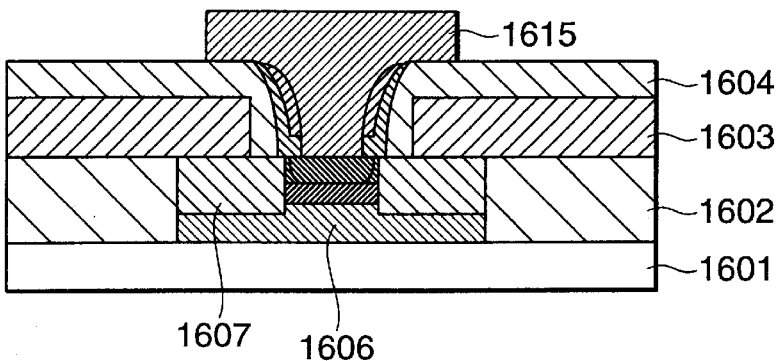
FIG. 17D is a cross-sectional view for showing the transistor according to the fourteenth embodiment of the present invention after an emitter electrode is formed.

Next, the wafer is oxidized to provide an extremely thin film at a low temperature to then grow a CVD oxide film 1610 and a CVD poly-crystal Si layer 1611 consecutively and etch this poly-crystal Si layer 1611 by in an anisotropic manner in order to leave it in a SW shape. Using thus left SW-shaped poly-crystal Si as a mask, the CVD oxide film is etched to expose the epitaxial Si layer 1609. Then, the Si layer is etched using an epitaxial growth apparatus in a hydrogen atmosphere containing HCL at a concentration of 1000 ppm. Specifically, it is etched off as much as about 8 nm or so to thereby form a recess region 1613 (FIG. 17B). Then, consecutively, Si is epitaxially grown at a phosphorus concentration of 1E19 atoms/cm³ to fill the recess region with a single-crystal Si layer 1614 (FIG. 17C). Furthermore, similar to the first embodiment, phosphorus-doped poly-crystal Si is generated to process an emitter electrode 1615 (FIG. 17D).

The present embodiment is different from the lowered numbered embodiments in that phosphorus-doped Si layer is grown epitaxially. That is, when a phosphorus-doped N⁺ poly-crystal Si layer expected to become the emitter electrode 1615 is formed, the intrinsic emitter region 1614 is already formed, the RTA processing is performed only to increase the activation ratio of the phosphorus-doped N⁺ type poly-crystal Si layer, thus making it possible to lower the processing temperature or reduce the processing time. This in turn makes it possible to form an extremely thin base layer in a stable manner.

Fifteenth Embodiment

FIGS. 18 show cross-sectional flow diagrams of the fifteenth embodiment. FIG. 18A shows a cross-sectional view of an N type Si-Ge (or Si-Ge-C) epitaxial growth layer after boron is diffused. Then, by performing RTO processing at 800° C., an exposed Si surface 1701 is thermally oxidized as much as 20 Å, then a CVD oxide film 1702 is formed throughout the surface to 50 nm or so, and then a poly-crystal Si layer 1703 is formed to 100 nm or so. Then, by performing anisotropic etching, this poly-crystal Si layer is left in a side wall shape. Furthermore, the CVD oxide film left in the opening is removed by anisotropic etching to expose the surface of the epitaxial Si layer. (FIG. 18B).

Figure 18A:
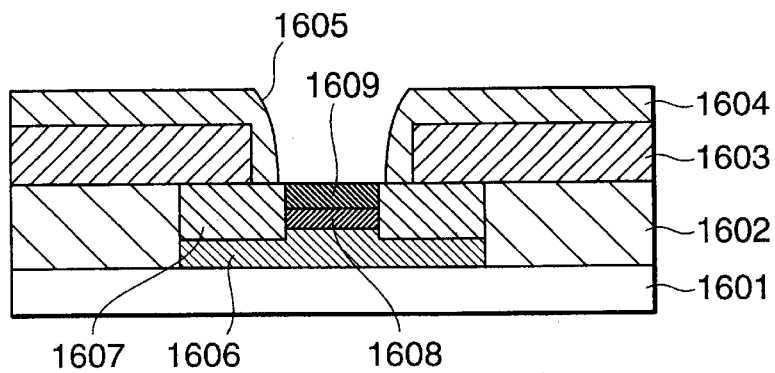
FIG. 18A is a cross-sectional view for showing a transistor according to the fourteenth embodiment of the present invention after an active base layer is formed.
Figure 18B:
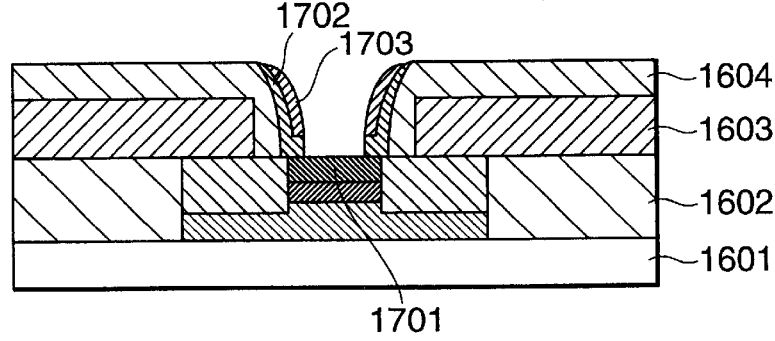
FIG. 18B is a cross-sectional view for showing the transistor according to the fourteenth embodiment of the present invention after side walls of a CVD oxide film and a CVD poly-crystal Si layer are formed.
Figure 18C:
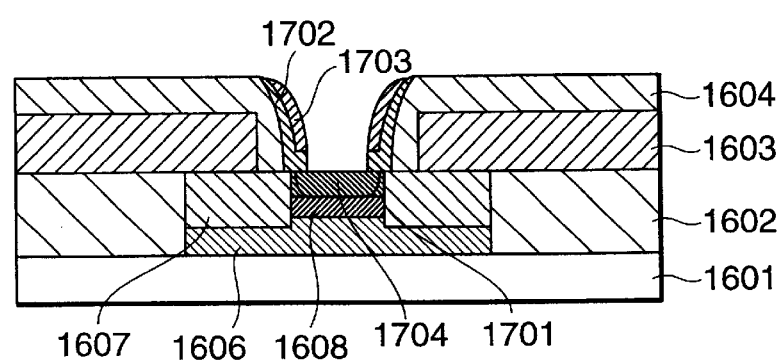
FIG. 18C is a cross-sectional view for showing the transistor according to the fourteenth embodiment of the present invention after $PH_3$ is diffused into an emitter layer.
Figure 18D:
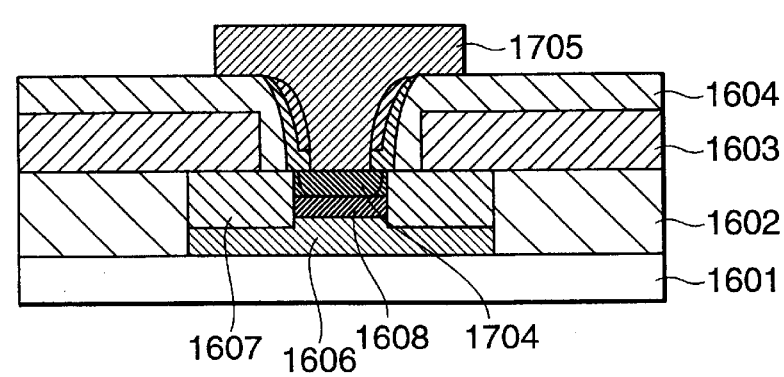
FIG. 18D is a cross-sectional view for showing the transistor according to the fourteenth embodiment of the present invention after an emitter electrode is formed.
Figure 19:
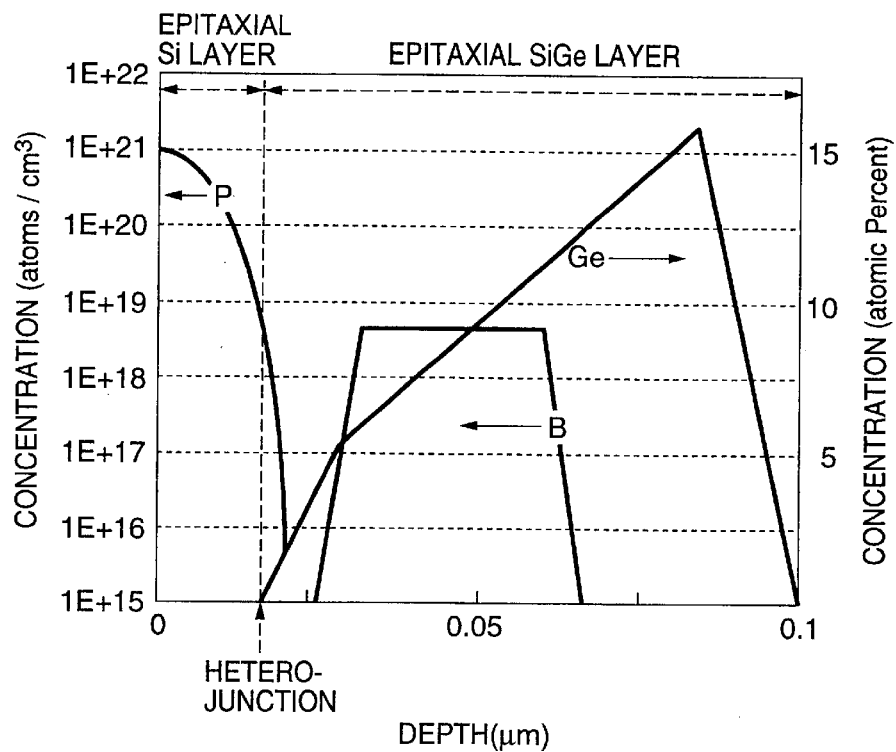
FIG. 19 is a graph for showing a concentration profile structure of a transistor junction according to a conventional technology.
Figure 20A:
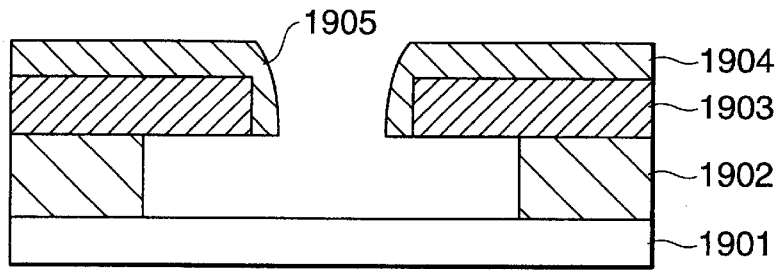
FIG. 20A is a cross-sectional view for showing a transistor according to the conventional technology after a nitride film side wall is formed and FIG. 20B is a cross-sectional view for showing the transistor according to the conventional technology after N type and P type Si-Ge layers and a cap Si layer are grown sequentially.
Figure 20B:
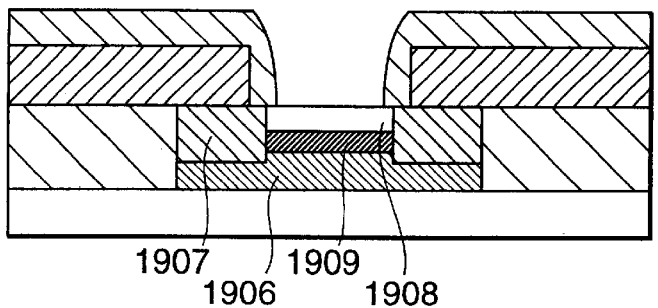

Next, the above-mentioned epitaxial reactor is used to diffuse phosphorus into the exposed Si surface in an hydrogen atmosphere containing $PH_3$ at 100 ppm to form an intrinsic emitter region 1704 by the diffusion (FIG. 18C). In this case, the temperature is supposed to be 750° C. and a carrier chamber is sufficiently purged of contaminants such as oxygen or water when loading the wafer into the apparatus with a loading temperature lowered to 600° C. or so. No baking is performed at a temperature in excess of 850° C. Then, a poly-crystal Si layer to which phosphorus is doped throughout the surface at 1E21 atoms/cm³ is formed to 200 nm and the phosphorus is activated by performing RTA at 900° C. for two seconds to stabilize its interface characteristics with respect to poly-crystal Si, thus processing an emitter electrode 1705 (FIG. 18D).

Similar to the fourteenth embodiment, the present embodiment avoids performing heat treatment at a high temperature for long time when an emitter is formed, thus making it possible to obtain a high-concentration thin base layer with suppressed fluctuations. In the present embodiment, the size of the grain of the poly-crystal Si is a few tens through a few hundreds of nano-meters, so that a process of forming an extremely shallow junction with a depth of 10 nm or so may possibly encounter non-negligible fluctuations in local junction depth. Although the series of embodiments utilizing segregation provide a structure or method that can tolerate fluctuations to some extent, preferably fluctuations in phosphorus diffusion are suppressed as much as possible. In this view, the present embodiment is not affected by the grain size, thus making it possible to form an emitter-base junction in a stable manner.

Although there have been hereinabove described preferred embodiments of the semiconductor device and the method for manufacturing the same in accordance with the present invention with reference to the accompanying drawings, it should be appreciated that the present invention is not limited thereto. Accordingly, any and all modifications, variations, or equivalent arrangements which may occur to those skilled in the art, should be considered to be within the scope of the present invention as defined in the appended claims.

As mentioned above, according to the present invention, in an Si-Ge-HBT or Si-Ge-C-HBT, any impurity is not doped to the base layer at the time of epitaxial growth thereof but diffused thermally from a non-doped or boron-doped Si layer surface to utilize segregation of boron at an interface between the Si layer and the Si-Ge (or Si-Ge-C) layer, thus making it possible to further reduce the thickness of the base layer and form it so as to be higher in concentration. Accordingly, it is possible to obtain a Si-Ge-HBT having speed performance extremely close to its limit value. Furthermore, since the PN junction position agrees with a hetero-junction interface between the Si layer and the Si-Ge (or Si-Ge-C) layer, it is possible to obtain a manufacturing step with high reproducibility and stability independently on fluctuations in concentration and film thickness caused by heat treatment.

What is claimed is:

1. A method for manufacturing a semiconductor device comprising:
    providing an N type single-crystal silicon substrate having a first silicon oxide film and a P type poly-crystal silicon layer formed thereon;
    forming a silicon nitride film on the P type poly-crystal silicon layer, wherein a side wall of the silicon nitride film is formed in an opening in the P type poly-crystal silicon layer above a portion expected to provide an active region, and the first silicon oxide film has an opening therein which is larger than the opening formed in the P type poly-crystal silicon layer;
    growing an N type IV-group semiconductor mixed crystal layer having a smaller band gap than silicon to a desired thickness on the single-crystal silicon substrate on which a surface of the portion expected to provide said active region is exposed;
    growing a non-doped single-crystal silicon layer on the IV-group semiconductor mixed crystal layer to a desired thickness;
    diffusing boron at a desired concentration from a surface of the non-doped single-crystal silicon layer; and
    forming a side wall containing a second silicon oxide film on an inner side of the side wall of the silicon nitride film and then growing a phosphorus-doped N type poly-crystal silicon layer throughout on the surface to perform processing and phosphorus diffusion on said N type poly-crystal silicon layer in order to provide an emitter electrode.

2. The method according to claim 1, wherein the IV-group semiconductor mixed crystal is silicon-germanium.

3. The method according to claim 1, wherein the IV-group semiconductor mixed crystal is silicon-germanium-carbon.

4. The method according to claim 3, wherein a profile is provided with such a gradient that a carbon concentration of said silicon-germanium-carbon layer may increase toward the surface.

5. The method according to claim 3, wherein a profile is provided with such a gradient that a carbon concentration of the silicon-germanium-carbon layer may increase toward the surface and rapidly increase at the surface.

6. The method according to claim 1, wherein in the boron diffusion step, after boron is diffused, heat treatment is conducted additionally.

7. The method according to claim 1, wherein in the boron diffusion step, after boron is diffused, the surface of said single-crystal silicon layer is removed as much as a desired thickness.

8. The method according to claim 1, wherein in the boron diffusion step, after boron is diffused, the surface of said single-crystal silicon layer is oxidized as much as a desired thickness to thereby form a sacrificial oxide film, and then the sacrificial oxide film is removed.

9. The method according to claim 1, wherein in the mixed crystal-layer growing step, before said N type IV-group semiconductor mixed crystal is grown, an N type silicon layer is grown so as to link with a layer grown from the P type poly-crystal silicon layer and then conduct annealing, thus providing a P type diffusion region from a link portion to the substrate surface.

10. The method according to claim 1, wherein in the mixed crystal layer growing step, a substrate of surface orientation (111) is used as the single-crystal silicon substrate, a poly-crystal silicon layer is grown on the active region so as to link with a layer grown from the P type poly-crystal silicon layer and then perform annealing treatment to thereby provide a P type diffusion region to the substrate surface, in order to remove the poly-crystal silicon layer on said active region, leaving the poly-crystal silicon layer only at a link portion with the P type poly-crystal silicon layer.

11. The method according to claim 1, wherein in the mixed crystal later growing step, the opening side wall has no silicon nitride film formed thereon.

12. The method according to claim 1, wherein in the phosphorus diffusion step, after side wall including the second silicon oxide film is formed, the single-crystal silicon layer into which boron is diffused is etched to then grow an N type single-crystal silicon layer at a desired phosphorus concentration to thereby fill the etched region.

13. The method according to claim 1, wherein in the phosphorus diffusion step, after side wall including the second silicon oxide film is formed, phosphorus is diffused at a desired concentration into the single-crystal silicon layer into which boron is diffused.

14. A method for manufacturing a semiconductor device comprising:
    providing an N type single-crystal silicon substrate having a first silicon oxide film and a P type poly-crystal silicon layer formed thereon;
    forming a silicon nitride film on the P type poly-crystal silicon layer, wherein a side wall of the silicon nitride film is formed in an opening in the P type-poly-crystal silicon layer above a portion expected to provide an active region, and the first silicon oxide film has an opening therein which is larger than the opening formed in the P type poly-crystal silicon layer;
    growing an N type IV-group semiconductor mixed crystal layer having a smaller band gap than silicon to a desired thickness on the single-crystal silicon substrate on which a surface of the portion expected to provide said active region is exposed;
    growing a non-doped single-crystal silicon layer on the IV-group semiconductor mixed crystal layer to a desired thickness;

forming an oxide layer on the non-doped single-crystal silicon layer;

introducing boron ions into the non-doped single-crystal silicon layer through the oxide layer;

annealing the boron introduced single-crystal silicon layer; and forming a side wall containing a second silicon oxide film on an inner side of the side wall of the silicon nitride film and then growing a phosphorus-doped N type poly-crystal silicon layer throughout on the surface to perform processing and phosphorus diffusion on said N type poly-crystal silicon layer in order to provide an emitter electrode.

15. The method according to claim 14, wherein in the phosphorus diffusion step, after side wall including the second silicon oxide film is formed, the single-crystal silicon layer into which boron is diffused is etched to then grow an N type single-crystal silicon layer at a desired phosphorus concentration to thereby fill the etched region.

16. The method according to claim 14, wherein in the phosphorus diffusion step, after side wall including the second silicon oxide film is formed, phosphorus is diffused at a desired concentration into the single-crystal silicon layer into which boron is diffused.

17. A method for manufacturing a semiconductor device comprising:

providing an N type single-crystal silicon substrate having a first silicon oxide film and a P type poly-crystal silicon layer formed thereon;

forming a silicon nitride film on the P type poly-crystal silicon layer, wherein a side wall of the silicon nitride film is formed in an opening in the P type poly-crystal silicon layer above a portion expected to provide an active region, and the first silicon oxide film has an opening therein which is larger than the opening formed in the P type poly-crystal silicon layer;

growing an N type IV-group semiconductor mixed crystal layer having a smaller band gap than silicon to a desired thickness on the single-crystal silicon substrate on which a surface of the portion expected to provide said active region is exposed;

growing a single-crystal silicon layer including boron on the IV-group semiconductor mixed crystal layer to a desired thickness;

annealing the single-crystal silicon layer including boron; and forming a side wall containing a second silicon oxide film on an inner side of the side wall of the silicon nitride film and then growing a phosphorus-doped N type poly-crystal silicon layer throughout on the surface to perform processing and phosphorus diffusion on said N type poly-crystal silicon layer in order to provide an emitter electrode.

18. The method according to claim 17, wherein in the phosphorus diffusion step, after side wall including the second silicon oxide film is formed, the single-crystal silicon layer into which boron is diffused is etched to then grow an N type single-crystal silicon layer at a desired phosphorus concentration to thereby fill the etched region.

19. The method according to claim 17, wherein in the phosphorus diffusion step, after side wall including the second silicon oxide film is formed, phosphorus is diffused at a desired concentration into the single-crystal silicon layer into which boron is diffused.

* * * * *